United States Patent
Akimoto et al.

(10) Patent No.: US 9,224,885 B2
(45) Date of Patent: *Dec. 29, 2015

(54) CONDUCTIVE COMPOSITIONS AND PROCESSES FOR USE IN THE MANUFACTURE OF SEMICONDUCTOR DEVICES—ORGANIC MEDIUM COMPONENTS

(71) Applicant: E I DU PONT DE NEMOURS AND COMPANY, Wilmington, DE (US)

(72) Inventors: Hideki Akimoto, Kanagawa (JP); Takuya Konno, Kanagawa (JP); Giovanna Laudisio, Bristol (GB); Patricia J. Ollivier, Raleigh, NC (US); Michael Rose, South Gloucestershire (GB); Jerome David Smith, Cary, NC (US); Richard John Sheffield Young, Somerset (GB)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/800,333

(22) Filed: Mar. 13, 2013

(65) Prior Publication Data

US 2013/0340821 A1    Dec. 26, 2013

Related U.S. Application Data

(63) Continuation of application No. 13/446,619, filed on Apr. 13, 2012, now Pat. No. 8,482,089, which is a continuation of application No. 12/473,586, filed on May 28, 2009, now Pat. No. 8,158,504.

(60) Provisional application No. 61/169,332, filed on Apr. 15, 2009, provisional application No. 61/057,348, filed on May 30, 2008.

(51) Int. Cl.

| | |
|---|---|
| H01L 31/0224 | (2006.01) |
| H01L 21/283 | (2006.01) |
| C03C 8/10 | (2006.01) |
| C03C 8/12 | (2006.01) |
| C03C 8/16 | (2006.01) |
| C03C 8/18 | (2006.01) |
| H01B 1/16 | (2006.01) |
| H01B 1/22 | (2006.01) |
| H01L 31/18 | (2006.01) |
| H01L 21/22 | (2006.01) |
| H05K 1/09 | (2006.01) |

(52) U.S. Cl.
CPC ............. *H01L 31/0224* (2013.01); *C03C 8/10* (2013.01); *C03C 8/12* (2013.01); *C03C 8/16* (2013.01); *C03C 8/18* (2013.01); *H01B 1/16* (2013.01); *H01B 1/22* (2013.01); *H01L 21/2225* (2013.01); *H01L 21/283* (2013.01); *H01L 31/022425* (2013.01); *H01L 31/18* (2013.01); *H05K 1/092* (2013.01); *Y02E 10/50* (2013.01)

(58) Field of Classification Search
CPC ... H01L 31/0224; H01L 21/283; H01L 31/18; H01L 31/022425
USPC ............... 257/40, 184, E31.001, E31.103, 257/E31.124; 438/584, 685–688
See application file for complete search history.

(56) References Cited

U.S. PATENT DOCUMENTS 3,681,713 A  *  8/1972  Degenkolb et al. ........... 333/219
4,837,383 A  *  6/1989  Andrews ...................... 427/108

(Continued)

*Primary Examiner* — Michele Fan

(57) ABSTRACT

Embodiments of the invention relate to a silicon semiconductor device, and a conductive paste for use in the front side of a solar cell device.

6 Claims, 6 Drawing Sheets

(56) References Cited

U.S. PATENT DOCUMENTS 5,169,890 A * 12/1992 Eadara et al. ................ 524/271
6,469,083 B1 * 10/2002 Opalko ........................ 524/291
7,935,277 B2 * 5/2011 Carroll et al. ................ 252/514
2003/0059607 A1 * 3/2003 Schumann et al. ....... 428/355 N
2007/0262846 A1 * 11/2007 Barge et al. .................. 338/308

* cited by examiner

CONDUCTIVE COMPOSITIONS AND PROCESSES FOR USE IN THE MANUFACTURE OF SEMICONDUCTOR DEVICES—ORGANIC MEDIUM COMPONENTS

FIELD OF THE INVENTION

Embodiments of the invention relate to a silicon semiconductor device, and a conductive paste for use in the front side of a solar cell device.

TECHNICAL BACKGROUND OF THE INVENTION

A conventional solar cell structure with a p-type base has a negative electrode that is typically on the front-side or sun side of the cell and a positive electrode on the backside. It is well-known that radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metalized, i.e., provided with metal contacts that are electrically conductive.

Electrode of solar cell is usually formed by applying a conductive paste onto a substrate and firing it. Conductive paste is applied onto the surface of solar cell and the paste is fired for sintering. Paste typically contains (a) conductive power such as silver or aluminum, (b) glass frit as inorganic binder, (c) organic medium and (d) optional additive. U.S. Pat. No. 7,494,607 discloses conventional organic mediums including ethylhydroxyethyl cellulose, wood rosin, mixtures of ethyl cellulose and phenolic resins, polymethacrylates of lower alcohols, monobutyl ether of ethylene glycol monoacetate ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters.

Although various methods and compositions for forming solar cells exist, there is a need for compositions, structures, and devices which have improved electrical performance, adhesion properties, and methods of making.

SUMMARY OF THE INVENTION

An embodiment of the present invention relates to a thick film conductive composition comprising:
(a) one or more electrically conductive powders;
(b) one or more glass frits; dispersed in
(c) organic medium selected from the group consisting of: Bis(2-(2Butoxyethoxy)Ethyl)Adipate, dibasic ester, Octyl Epoxy Tallate, isotetradecanol, and pentaerythritol ester of hydrogenated rosin.

In an aspect of the embodiment, the glass frit may comprise, based on weight percent of total glass composition: $SiO_2$ 1-36, $Al_2O_3$ 0-7, $B_2O_3$ 1.5-19, PbO 20-83, ZnO 0-42, CuO 0-4, $Bi_2O_3$ 0-35, $ZrO_2$ 0-8, $TiO_2$ 0-7, $PbF_2$ 3-34.

In an embodiment, the composition may further comprise an additive. In an aspect, the additive may be a metal/metal oxide additive selected from (a) a metal wherein said metal is selected from Zn, Mg, Gd, Ce, Zr, Ti, Mn, Sn, Ru, Co, Fe, Cu, and Cr; (b) a metal oxide of one or more of the metals selected from Zn, Mg, Gd, Ce, Zr, Ti, Mn, Sn, Ru, Co, Fe, Cu and Cr; (c) any compounds that can generate the metal oxides of (b) upon firing; and (d) mixtures thereof. In an aspect of the embodiment, the Zn-containing additive is ZnO.

An embodiment of the invention relates to a structure, wherein the structure comprises the thick film composition and a substrate. The substrate may be one or more insulating layers. The substrate may be one or more semiconductor substrates. In an aspect, the thick film composition may be formed on the one or more insulating layers. In an aspect, the one or more insulating layers may be formed on a semiconductor substrate. In a further aspect, upon firing, the organic vehicle is removed and the silver and glass frits are sintered.

In an embodiment of the invention, an electrode is formed from the composition, and said composition has been fired to remove the organic vehicle and sinter the glass particles.

An embodiment of the invention relates to a method of manufacturing a semiconductor device. The method comprises the steps of:
(a) providing one or more semiconductor substrates, one or more insulating films, and a thick film composition, wherein the thick film composition comprises: a) one or more electrically conductive powders, b) one or more glass frits, dispersed in c) an organic medium selected from the group consisting of: Bis(2-(2Butoxyethoxy)Ethyl)Adipate, dibasic ester, Octyl Epoxy Tallate, isotetradecanol, and pentaerythritol ester of hydrogenated rosin,
(b) applying the insulating film on the semiconductor substrate,
(c) applying the thick film composition on the insulating film on the semiconductor substrate, and
(d) firing the semiconductor, insulating film and thick film composition, wherein, upon firing, the organic vehicle is removed, the silver and glass frits are sintered, and the insulating film is penetrated by components of the thick film composition.

In an aspect of the embodiment, the insulating film comprises one or more components selected from: titanium oxide, silicon nitride, SiNx:H, silicon oxide, and silicon oxide/titanium oxide.

A further embodiment relates to structures including the thick film conductive composition. The structure may include an insulating layer. The structure may include a semiconductor substrate. An aspect of the present invention relates to semiconductor devices that contain the structure. An aspect of the present invention relates to photovoltaic devices that contain the structure. An aspect of the present invention relates to solar cells that contain the structure. An aspect of the present invention relates to solar panels that contain the structure.

501: silver front electrode according to the invention (formed by firing front side silver paste)

Figure 1A:
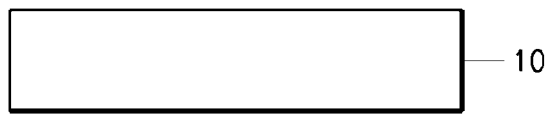
FIG. 1A-1F is a process flow diagram illustrating the fabrication of a semiconductor device.
Reference numerals shown in FIG. 1 are explained below.
10: p-type silicon substrate
20: n-type diffusion layer
30: silicon nitride film, titanium oxide film, or silicon oxide film
40: p+ layer (back surface field, BSF)
60: aluminum paste formed on backside
61: aluminum back electrode (obtained by firing back side aluminum paste)
70: silver or silver/aluminum paste formed on backside
71: silver or silver/aluminum back electrode (obtained by firing back side silver paste)
500: silver paste formed on front side according to the invention

FIG. 1(a) shows a step in which a substrate is provided, with a textured surface which reduces light reflection. In an embodiment, a semiconductor substrate of single-crystal silicon or of multicrystalline silicon is provided. In the case of solar cells, substrates may be sliced from ingots which have been formed from pulling or casting processes. Substrate surface damage caused by tools such as a wire saw used for slicing and contamination from the wafer slicing step may be removed by etching away about 10 to 20 µm of the substrate surface using an aqueous alkali solution such as aqueous potassium hydroxide or aqueous sodium hydroxide, or using a mixture of hydrofluoric acid and nitric acid. In addition, a step in which the substrate is washed with a mixture of hydrochloric acid and hydrogen peroxide may be added to remove heavy metals such as iron adhering to the substrate surface. An antireflective textured surface is sometimes formed thereafter using, for example, an aqueous alkali solution such as aqueous potassium hydroxide or aqueous sodium hydroxide. This gives the substrate, 10.

Figure 1B:
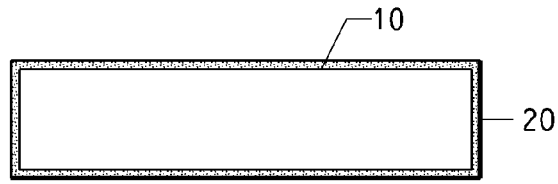
Figure 1C:

Next, referring to FIG. 1(b), when the substrate used is a p-type substrate, an n-type layer is formed to create a p-n junction. The method to form such an n-type layer may be phosphorus (P) diffusion using phosphorus oxychloride ($POCl_3$). The depth of the diffusion layer in this case can be varied by controlling the diffusion temperature and time, and is generally formed within a thickness range of about 0.3 to 0.5 µm. The n-type layer formed in this way is represented in the diagram by reference numeral 20. Next, p-n separation on the front and backsides may be carried out by the method described in the background of the invention. These steps are not always necessary when a phosphorus-containing liquid coating material such as phosphosilicate glass (PSG) is applied onto only one surface of the substrate by a process, such as spin coating, and diffusion is effected by annealing under suitable conditions. Of course, where there is a risk of an n-type layer forming on the backside of the substrate as well, the degree of completeness can be increased by employing the steps detailed in the background of the invention.

Figure 1D:
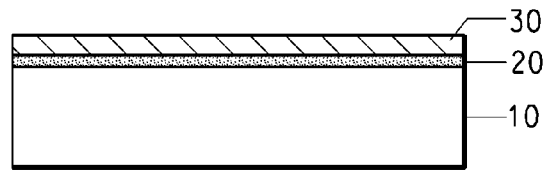

Next, in FIG. 1(d), a silicon nitride film or other insulating films including SiNx:H (i.e., the insulating film comprises hydrogen for passivation during subsequent firing processing) film, titanium oxide film, and silicon oxide film, 30, which functions as an antireflection coating is formed on the above-described n-type diffusion layer, 20. This silicon nitride film, 30, lowers the surface reflectance of the solar cell to incident light, making it possible to greatly increase the electrical current generated. The thickness of the silicon nitride film, 30, depends on its refractive index, although a thickness of about 700 to 900 Å is suitable for a refractive index of about 1.9 to 2.0. This silicon nitride film may be formed by a process such as low-pressure CVD, plasma CVD, or thermal CVD. When thermal CVD is used, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a compositional ratio between the silicon and the nitrogen of $Si_3N_4$ which is substantially stoichiometric. The refractive index falls within a range of substantially 1.96 to 1.98. Hence, this type of silicon nitride film is a very dense film whose characteristics, such as thickness and refractive index, remain unchanged even when subjected to heat treatment in a later step. The starting gas used when film formation is carried out by plasma CVD is generally a gas mixture of $SiH_4$ and $NH_3$. The starting gas is decomposed by the plasma, and film formation is carried out at a temperature of 300 to 550° C. Because film formation by such a plasma CVD process is carried out at a lower temperature than thermal CVD, the hydrogen in the starting gas is present as well in the resulting silicon nitride film. Also, because gas decomposition is effected by a plasma, another distinctive feature of this process is the ability to greatly vary the compositional ratio between the silicon and nitrogen. Specifically, by varying such conditions as the flow rate ratio of the starting gases and the pressure and temperature during film formation, silicon nitride films can be formed at varying compositional ratios between silicon, nitrogen and hydrogen, and within a refractive index range of 1.8 to 2.5. When a film having such properties is heat-treated in a subsequent step, the refractive index may change before and after film formation due to such effects as hydrogen elimination in the electrode firing step. In such cases, the silicon nitride film required in a solar cell can be obtained by selecting the film-forming conditions after first taking into account the changes in film qualities that will occur as a result of heat treatment in the subsequent step.

In FIG. 1(d), a titanium oxide film may be formed on the n-type diffusion layer, 20, instead of the silicon nitride film, 30, functioning as an antireflection coating. The titanium oxide film is formed by coating a titanium-containing organic liquid material onto the n-type diffusion layer, 20, and firing, or by thermal CVD. It is also possible, in FIG. 1(d), to form a silicon oxide film on the n-type diffusion layer, 20, instead of the silicon nitride film 30 functioning as an antireflection layer. The silicon oxide film is formed by thermal oxidation, thermal CVD or plasma CVD.

Figure 1E:
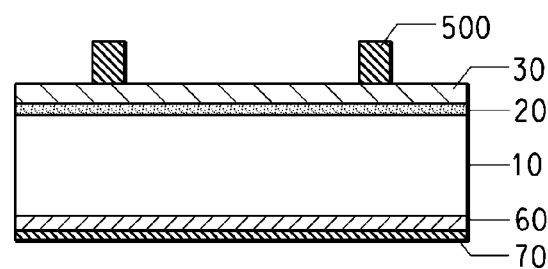

Next, electrodes are formed by steps similar to those shown in FIGS. 1(e) and (f). That is, as shown in FIG. 1(e), aluminum paste, 60, and back side silver paste, 70, are screen printed onto the back side of the substrate, 10, as shown in FIG. 1(e) and successively dried. In addition, a front electrode-forming silver paste is screen printed onto the silicon nitride film, 30, in the same way as on the back side of the substrate, 10, following which drying and firing are carried out in an infrared furnace; the set point temperature range may be 700 to 975° C. for a period of from one minute to more than ten minutes while a mixed gas stream of oxygen and nitrogen are passed through the furnace.

Figure 1F:
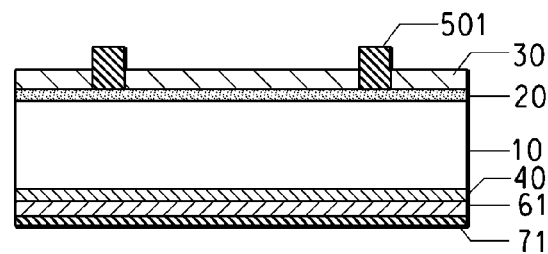

As shown in FIG. 1(f), during firing, aluminum diffuses as an impurity from the aluminum paste into the silicon substrate, 10, on the back side, thereby forming a p+ layer, 40, containing a high aluminum dopant concentration. Firing converts the dried aluminum paste, 60, to an aluminum back electrode, 61. The backside silver paste, 70, is fired at the same time, becoming a silver back electrode, 71. During firing, the boundary between the backside aluminum and the backside silver assumes the state of an alloy, thereby achieving electrical connection. Most areas of the back electrode are occupied by the aluminum electrode, partly on account of the need to form a p+ layer, 40. The silver or silver/aluminum back electrode is formed on limited areas of the backside as an electrode for interconnecting solar cells by means of copper ribbon or the like.

On the front side, the front electrode silver paste, 500, of the invention is composed of silver, Zn-containing additive, glass frit, organic medium and optional metal oxides, and is capable of reacting and penetrating through the silicon nitride film, 30, during firing to achieve electrical contact with the n-type layer, 20 (fire through). This fired-through state, i.e., the extent to which the front electrode silver paste melts and passes through the silicon nitride film, 30, depends on the quality and thickness of the silicon nitride film, 30, the composition of the front electrode silver paste, and on the firing conditions. The conversion efficiency and moisture resistance reliability of the solar cell clearly depend, to a large degree, on this fired-through state.

Figure 2A:
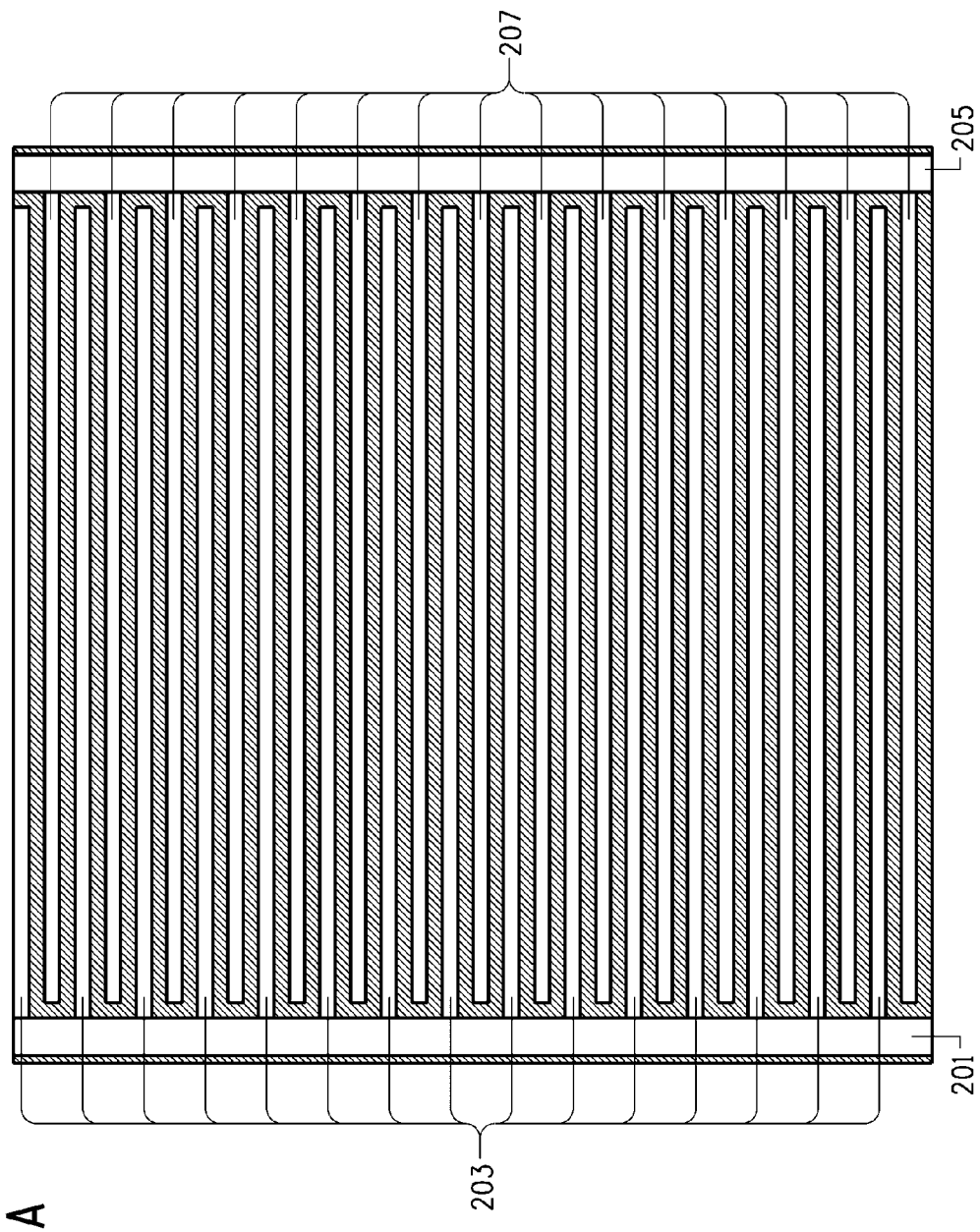

FIG. 2A provides a top side view of an exemplary semiconductor in which the thick film conductor composition has been printed on the substrate to form two busbars.

Figure 2B:
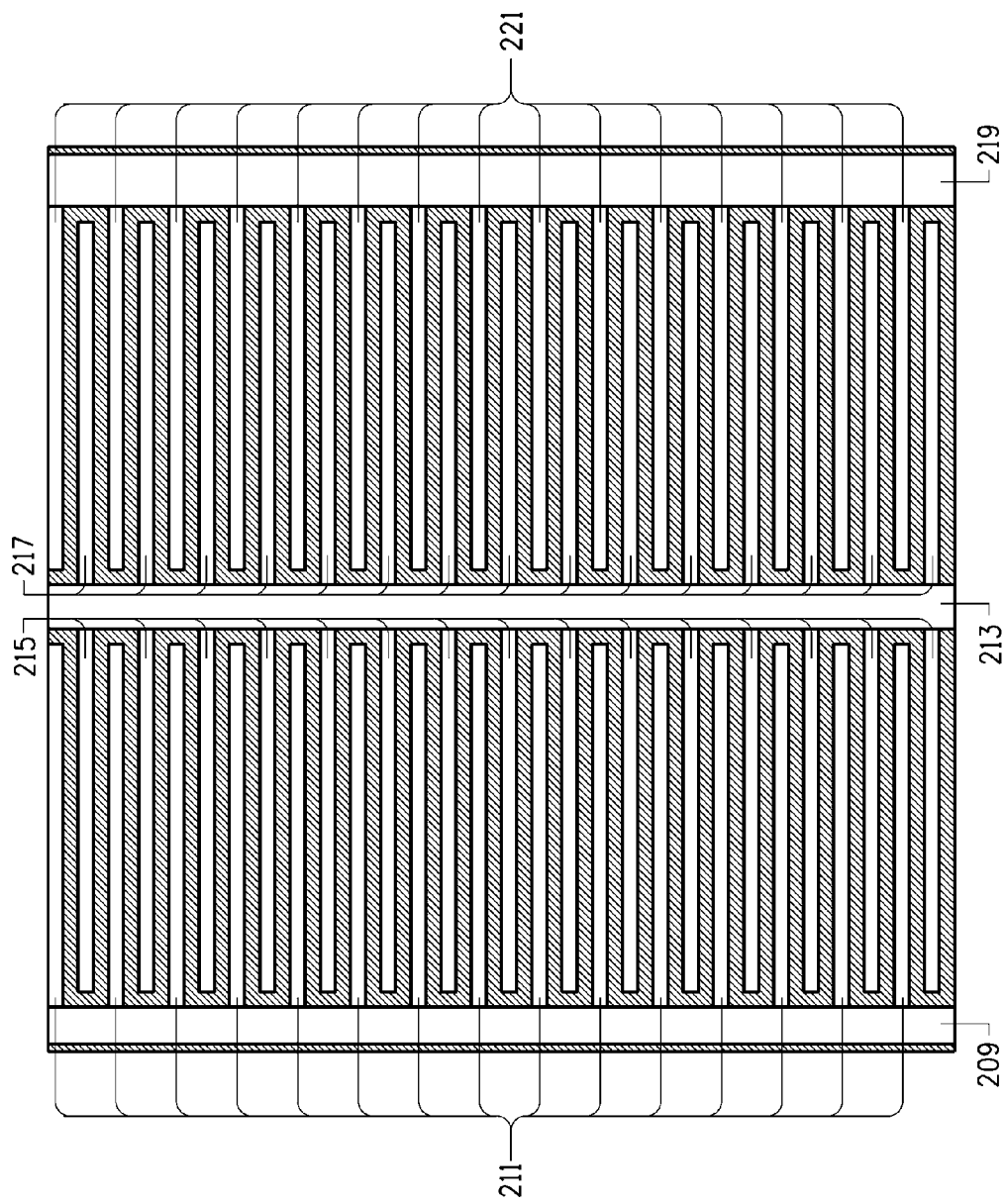

FIG. 2B provides a top side view of an exemplary semiconductor in which the thick film conductor composition has been printed on the substrate to form three busbars.

Figure 3:
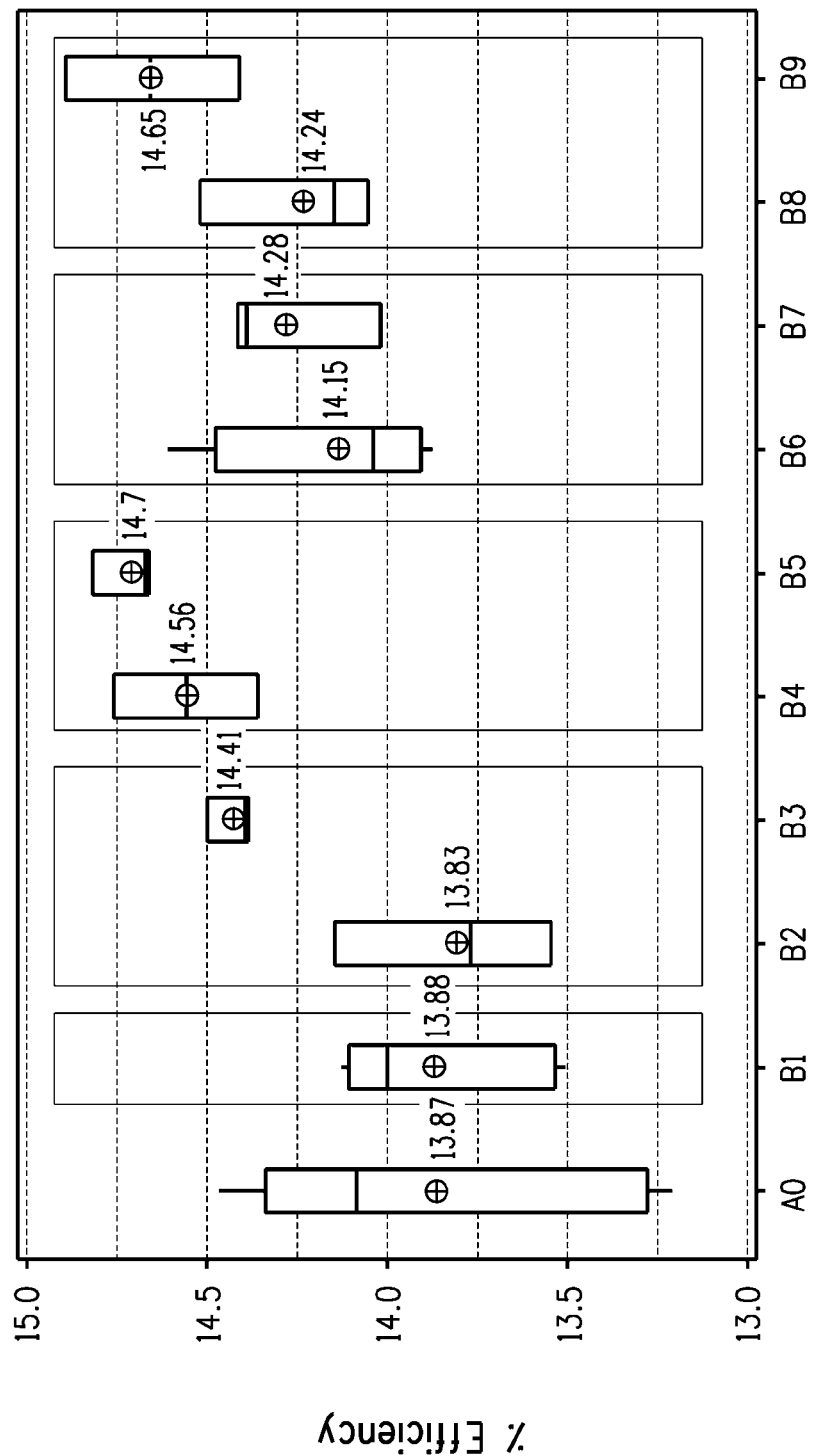

FIG. 3 illustrates the % efficiency for 200 µm wide lines with composition A0, and B1 to B9, described herein.

Figure 4:
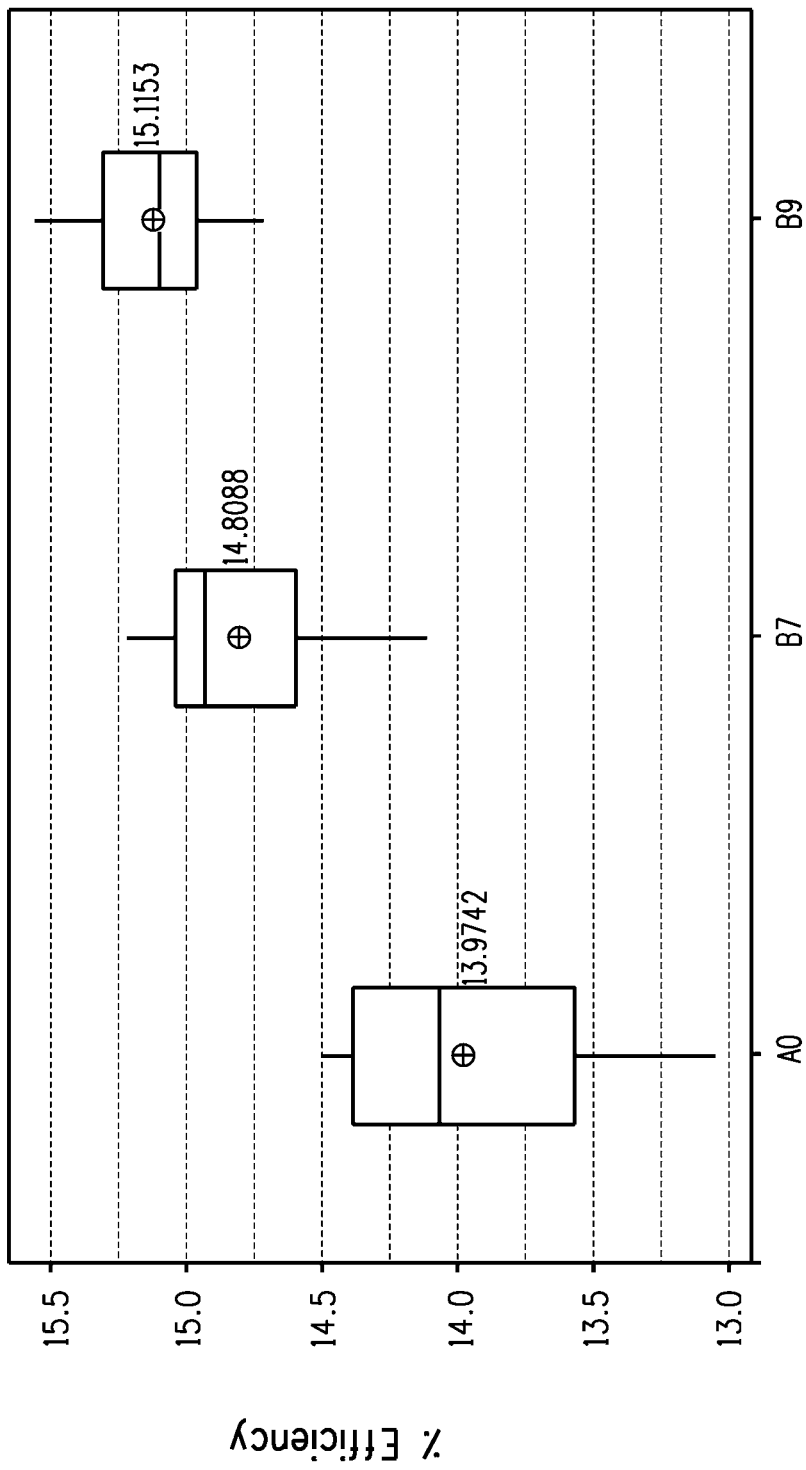

FIG. 4 illustrates the % efficiency for 100 micron lines with compositions described herein.

Figure 5:
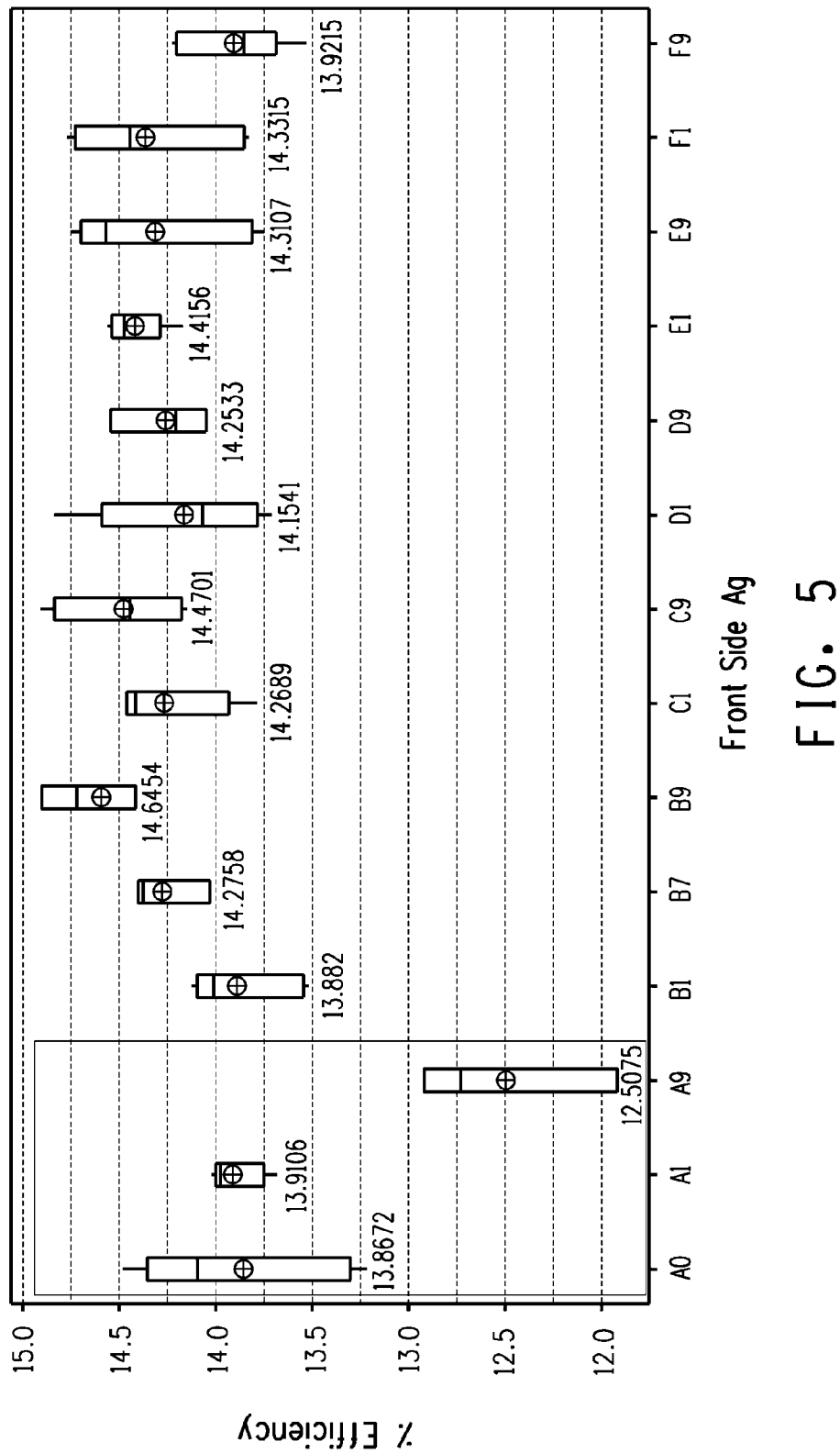

FIG. 5 illustrates the % efficiency for 200 µm wide lines with compositions described herein.

DETAILED DESCRIPTION OF THE INVENTION

The present invention addresses the need for semiconductor compositions with improved electrical performance, semiconductor devices, methods of manufacturing the semiconductor devices, and the like.

An embodiment of the present invention relates to thick film conductor compositions. In an aspect of the embodiment, the thick film conductor compositions may include: a conductive powder, a flux material, and an organic medium. The flux material may be glass frit or mixture of glass frits. The organic medium may include one or more components selected from the group consisting of: Bis(2-(2Butoxyethoxy)Ethyl) Adipate, dibasic ester such as DBE, DBE-2, DBE-3, DBE-4, DBE-5, DBE-6, DBE-9, DBE-IB (DBE series are different in terms of mixed ratio of components), Octyl Epoxy Tallate [DRAPEX (R) 4.4] from Witco Chemical, and Oxocol (isotetradecanol made by Nissan Chemical) and Foralyn™ 110 (pentaerythritol ester of hydrogenated rosin from Eastman Chemical BV). The thick film conductor compositions may also include an additive. The thick film conductor compositions may include additional additives or components.

An embodiment of the present invention relates to structures, wherein the structures include the thick film conductor compositions. In an aspect, the structure also includes one or more insulating films. In an aspect, the structure does not include an insulating film. In an aspect, the structure includes a semiconductor substrate. In an aspect, the thick film conductor composition may be formed on the one or more insulating films. In an aspect, the thick film conductor composition may be formed on the semiconductor substrate. In the aspect wherein the thick film conductor composition may be formed on the semiconductor substrate, the structure may not contain an applied insulating film.

In an embodiment, the thick film conductor composition may be printed on the substrate to form busbars. The busbars may be more than two busbars. For example, the busbars may be three or more busbars. In addition to busbars, the thick film conductor composition may be printed on the substrate to form connecting lines. The connecting lines may contact a busbar. The connecting lines contacting a busbar may be interdigitated between the connecting lines contacting a second busbar.

In an exemplary embodiment, three busbars may be parallel to each other on a substrate. The busbars may be rectangular in shape. Each of the sides of the middle busbar may be in contact with connecting lines. On each of the side busbars, only one side of the rectangle may be in contact with connecting lines. The connecting lines contacting the side busbars may interdigitate with the connecting lines contacting the middle busbar. For example, the connecting lines contacting one side busbar may interdigitate with the connecting lines contacting the middle busbar on one side, and the connecting lines contacting the other side busbar may interdigitate with the connecting lines contacting the middle busbar on the other side of the middle busbar.

FIG. 2A provides an exemplary representation of an embodiment in which there are two busbars. A first busbar 201 is in contact with a first set of connecting lines 203. A second busbar 205 is in contact with a second set of connecting lines 207. The first set of connecting lines 203 interdigitate with the second set of connecting lines 207.

FIG. 2B provides an exemplary representation of an embodiment in which there are three busbars. A first busbar 209 is in contact with a first set of connecting lines 211. A second busbar 213 is in contact with both a second set of connecting lines 215 and a third set of connecting lines 217. The second set of connecting lines 215 contacts one side of the second busbar 213; the third set of connecting lines 217 contacts the opposite side of the second busbar 213. A third busbar 219 is in contact with a fourth set of connecting lines 221. The first set of connecting lines 211 interdigitate with the second set of connecting lines 215. The third set of connecting lines 217 interdigitate with the fourth set of connecting lines 221.

In an embodiment, the busbar formed on the substrate may consist of two busbars arrayed in a parallel arrangement with conductor lines formed perpendicular to the busbar and arrayed in an interdigitated parallel line pattern. Alternately, the busbars may be three or more busbars. In the case of three busbars, the central busbar may serve as a common between the busbars to each side in a parallel arrangement. In this embodiment, the area coverage of the three busbars may be adjusted to approximately the same as the case for the use of two busbars. In the case of three busbars, the perpendicular lines are adjusted to shorter dimensions appropriate to the spacing between pairs of busbars.

In an embodiment, the components of the thick film conductor composition(s) are electrically functional silver powders, one or more additive(s), and a glass frit dispersed in an organic medium, wherein the organic medium comprises one or more components selected from the group consisting of: Bis(2-(2Butoxyethoxy)Ethyl)Adipate, DBE, DBE-2, DBE-3, DBE-4, DBE-5, DBE-6, DBE-9, DBE-IB, Octyl Epoxy Tallate [DRAPEX (R) 4.4] from Witco Chemical, and Oxocol (isotetradecanol made by Nissan Chemical) and Foralyn™ 110 (pentaerythritol ester of hydrogenated rosin from Eastman Chemical BV). The glass frit may be lead-free. Additional additives may include metals, metal oxides or any compounds that can generate these metal oxides during firing. The components are discussed herein below.

I. Inorganic Components

An embodiment of the present invention relates to thick film conductor compositions. In an aspect of the embodiment, the thick film conductor compositions may include: a conductive material, a flux material, and an organic medium. The conductive material may include silver. In an embodiment, the conductive material may be a conductive powder. The flux material may include a glass frit or glass frits. The glass frit may be lead-free. The thick film conductor compositions may also include an additive. The additive may be a metal/metal oxide additive selected from (a) a metal wherein said metal is selected from Zn, Mg, Gd, Ce, Zr, Ti, Mn, Sn, Ru, Co, Fe, Cu and Cr; (b) a metal oxide of one or more of the metals selected from Zn, Mg, Gd, Ce, Zr, Ti, Mn, Sn, Ru, Co, Fe, Cu and Cr; (c) any compounds that can generate the metal oxides of (b)

upon firing; and (d) mixtures thereof. The thick film conductor compositions may include additional components.

As used herein, "busbars" means a common connection used for collection of electrical current. In an embodiment, the busbars may be rectangular shaped. In an embodiment, the busbars may be parallel.

As used herein, "flux material" means a substance used to promote fusion, or a substance that fuses. In an embodiment, the fusion may be at or below required process temperatures to form a liquid phase.

In an embodiment, the inorganic components of the present invention comprise (1) electrically functional silver powders; (2) glass frit; and optionally (3) one or more metal/metal oxide additive selected from (a) a metal wherein said metal is selected from Zn, Mg, Gd, Ce, Zr, Ti, Mn, Sn, Ru, Co, Fe, Cu and Cr; (b) a metal oxide of one or more of the metals selected from Zn, Mg, Gd, Ce, Zr, Ti, Mn, Sn, Ru, Co, Fe, Cu and Cr; (c) any compounds that can generate the metal oxides of (b) upon firing; and (d) mixtures thereof. In an embodiment, the glass frit may be lead-free.

A. Electrically Conductive Functional Materials

Electrically conductive materials may include Ag, Cu, Pd, and mixtures thereof. In an embodiment, the electrically conductive particle is Ag. However, these embodiments are intended to be non-limiting. Embodiments in which other conductive materials are utilized are contemplated and encompassed.

The silver may be in a particle form, a powder form, a flake form, spherical form, provided in a colloidal suspension, a mixture thereof, etc. The silver may be silver metal, alloys of silver, or mixtures thereof, for example. The silver may include silver oxide ($Ag_2O$) or silver salts such as AgCl, $AgNO_3$, or $AgOOCCH_3$ (silver acetate), silver orthophosphate, $Ag_3PO_4$, or mixtures thereof, for example. Any form of silver compatible with the other thick film components may be used, and will be recognized by one of skill in the art.

The silver may be any of a variety of percentages of the composition of the thick film composition. In a non-limiting embodiment, the silver may be from about 70 to about 99 wt % of the solid components of the thick film composition. In a further embodiment, the silver may be from about 70 to about 85 wt % of the solid components of the thick film composition. In a further embodiment, the silver may be from about 90 to about 99 wt % of the solid components of the thick film composition.

In an embodiment, the solids portion of the thick film composition may include about 80 to about 90 wt % silver particles and about 0 to about 100 wt %, for example 0 to 50 wt %, 0 to 20 wt % silver flakes. In an embodiment, the solids portion of the thick film composition may include about 50 to about 90 wt % silver particles and about 0 to about 10 wt % silver flakes. In another embodiment, the solids portion of the thick film composition may include about 75 to about 90 wt % silver flakes and about 1 to about 10 wt % of colloidal silver. In a further embodiment, the solids portion of the thick film composition may include about 60 to about 90 wt % of silver powder or silver flakes and about 0.1 to about 20 wt % of colloidal silver.

In an embodiment, a thick film composition includes a functional phase that imparts appropriate electrically functional properties to the composition. The functional phase may include electrically functional powders dispersed in an organic medium that acts as a carrier for the functional phase that forms the composition. In an embodiment, the composition may be applied to a substrate. In a further embodiment, the composition and substrate may be fired to burn out the organic phase, activate the inorganic binder phase and to impart the electrically functional properties.

In an embodiment, the functional phase of the composition may be coated or uncoated silver particles which are electrically conductive. In an embodiment, the silver particles may be coated. In an embodiment, the silver may be coated with various materials such as phosphorus. In an embodiment, the silver particles may be at least partially coated with a surfactant. The surfactant may be selected from, but is not limited to, stearic acid, palmitic acid, a salt of stearate, a salt of palmitate and mixtures thereof. Other surfactants may be utilized including lauric acid, palmitic acid, oleic acid, stearic acid, capric acid, myristic acid and linolic acid. The counter-ion can be, but is not limited to, hydrogen, ammonium, sodium, potassium and mixtures thereof.

The particle size of the silver is not subject to any particular limitation. In an embodiment, an average particle size is less than 10 microns; in a further embodiment, the average particle size is less than 5 microns. In an embodiment, the average particle size may be from 0.1 to 5 microns.

In an embodiment, silver oxide may be dissolved in the glass during the glass melting/manufacturing process.

B. Additive(s)

An embodiment of the present invention relates to thick film compositions which contain one or more additive. In an aspect of this embodiment, the additive may be a metal/metal oxide additive selected from (a) a metal wherein said metal is selected from Zn, Mg, Gd, Ce, Zr, Ti, Mn, Sn, Ru, Co, Fe, Cu and Cr; (b) a metal oxide of one or more of the metals selected from Zn, Mg, Gd, Ce, Zr, Ti, Mn, Sn, Ru, Co, Fe, Cu and Cr; (c) any compounds that can generate the metal oxides of (b) upon firing; and (d) mixtures thereof.

In an embodiment, the particle size of the additives is not subject to any particular limitation. In an embodiment, an average particle size may be less than 10 microns; in an embodiment, an average particle size may be less than 5 microns. In an embodiment, the average particle size may be from 0.1 to 1.7 microns. In a further embodiment, the average particle size may be from 0.6 to 1.3 microns. In an embodiment, the average particle size may be from 7 to 100 nm. In a further embodiment, the particle size of the additives can be at the atomic or molecular level when an organo-metallic compound such as a metal resinate is used.

In an embodiment, the particle size of the metal/metal oxide additive may be in the range of 7 nanometers (nm) to 125 nm. In an embodiment, the particle size of the metal/metal oxide additive may be in the range of 7 nanometers (nm) to 100 nm. In an embodiment, $MnO_2$ and $TiO_2$ may be utilized in the present invention with an average particle size range ($d_{50}$) of 7 nanometers (nm) to 125 nm. In a further embodiment, the particle size of the additives can be at the atomic or molecular level when an organo-metallic compound such as a metal resinate is used.

In an embodiment, the additional additive may be a Zn-containing additive. The Zn-containing additive may, for example be selected from (a) Zn, (b) metal oxides of Zn, (c) any compounds that can generate metal oxides of Zn upon firing, and (d) mixtures thereof.

In one embodiment, the Zn-containing additive is ZnO, wherein the ZnO may have an average particle size in the range of 10 nanometers to 10 microns. In a further embodiment, the ZnO may have an average particle size of 40 nanometers to 5 microns. In still a further embodiment, the ZnO may have an average particle size of 60 nanometers to 3 microns. In a further embodiment, the Zn-containing additive may have an average particle size of less than 0.1 μm. In particular the Zn-containing additive may have an average particle size in the range of 7 nanometers to less than 100 nanometers.

In a further embodiment the Zn-containing additive (for example Zn, Zn resinate, etc.) may be present in the total thick film composition in the range of 2 to 16 weight percent. In a further embodiment the Zn-containing additive may be present in the range of 4 to 12 weight percent total composition. In an embodiment, ZnO may be present in the composition in the range of 2 to 10 weight percent total composition. In an embodiment, the ZnO may be present in the range of 4 to 8 weight percent total composition. In still a further embodiment, the ZnO may be present in the range of 5 to 7 weight percent total composition.

In an embodiment, the additional additive may be a Mg-containing additive. The Mg-containing additive may, for example be selected from (a) Mg, (b) metal oxides of Mg, (c) any compounds that can generate metal oxides of Mg upon firing, and (d) mixtures thereof.

In one embodiment, the Mg-containing additive is MgO, wherein the MgO may have an average particle size in the range of 10 nanometers to 10 microns. In a further embodiment, the MgO may have an average particle size of 40 nanometers to 5 microns. In still a further embodiment, the MgO may have an average particle size of 60 nanometers to 3 microns. In a further embodiment, the MgO may have an average particle size of 0.1 to 1.7 microns. In a further embodiment, the MgO may have an average particle size of 0.3 to 1.3 microns. In a further embodiment, the Mg-containing additive may have an average particle size of less than 0.1 µm. In particular the Mg-containing additive may have an average particle size in the range of 7 nanometers to less than 100 nanometers.

MgO may be present in the composition in the range of 0.1 to 10 weight percent total composition. In one embodiment, the MgO may be present in the range of 0.5 to 5 weight percent total composition. In still a further embodiment, the MgO may be present in the range of 0.75 to 3 weight percent total composition.

In a further embodiment the Mg-containing additive (for example Mg, Mg resinate, MgO, etc.) may be present in the total thick film composition in the range of 0.1 to 10 weight percent. In a further embodiment the Mg-containing additive may be present in the range of 0.5 to 5 weight percent total composition. In still a further embodiment, the Mg-containing additive may be present in the range of 0.75 to 3 weight percent total composition.

In a further embodiment, the Mg-containing additive may have an average particle size of less than 0.1 µm. In particular the Mg-containing additive may have an average particle size in the range of 7 nanometers to less than 100 nanometers.

In an embodiment, the additive may contain a mixture of additives. The additional additive may be a mixture of metal/metal oxide additives selected from (a) a metal wherein said metal is selected from Zn, Mg, Gd, Ce, Zr, Ti, Mn, Sn, Ru, Co, Fe, Cu and Cr; (b) a metal oxide of one or more of the metals selected from Zn, Mg, Gd, Ce, Zr, Ti, Mn, Sn, Ru, Co, Fe, Cu and Cr; (c) any compounds that can generate the metal oxides of (b) upon firing; and (d) mixtures thereof.

Compounds that can generate metal oxides of Zn, Mg, Gd, Ce, Zr, Ti, Mn, Sn, Ru, Co, Fe, Cu or Cr upon firing include, but are not limited to resinates, octoates, organic functional units, and the like.

In an embodiment, the additional additive may contain a mixture of ZnO and MgO.

C. Glass Frit

In an embodiment of the invention, the thick film composition may include glass materials. In an embodiment, glass materials may include one or more of three groups of constituents: glass formers, intermediate oxides, and modifiers. Exemplary glass formers may have a high bond coordination and smaller ionic size; the glass formers may form bridging covalent bonds when heated and quenched from a melt. Exemplary glass formers include, but are not limited to: $SiO_2$, $B_2O_3$, $P_2O_5$, $V_2O_5$, $GeO_2$ etc. Exemplary intermediate oxides include, but are not limited to: $TiO_2$, $Ta_2O_5$, $Nb_2O_5$, $ZrO_2$, $CeO_2$, $SnO_2$, $Al_2O_3$, $HfO_2$ and the like. Intermediate oxides may be used to substitute glass formers, as recognized by one of skill in the art. Exemplary modifiers may have a more ionic nature. The modifiers may affect specific properties; for example, modifiers may result in reduction of glass viscosity and/or modification of glass wetting properties, for example. Exemplary modifiers include, but are not limited to: oxides such as alkali metal oxides, alkaline earth oxides, PbO, CuO, CdO, ZnO, $Bi_2O_3$, $Ag_2O$, $MoO_3$, $WO_3$ and the like.

In an embodiment, the glass materials may be selected by one of skill in the art to assist in the at least partial penetration of oxide or nitride insulating layers. As described herein, this at least partial penetration may lead to the formation of an effective electrical contact to the silicon surface of a photovoltaic device structure. The formulation components are not limited to glass forming materials.

In an embodiment of the invention, glass frit compositions (glass compositions) are provided. Non-limiting examples of glass frit compositions are listed in Table 1 below and described herein. Additional glass frit compositions are contemplated.

It is important to note that the compositions listed in Table 1 are not limiting, as it is expected that one skilled in glass chemistry could make minor substitutions of additional ingredients and not substantially change the properties of the glass composition of this invention. In this way, 0-3 weight % substitutions of glass formers such as $P_2O_5$, $GeO_2$, $V_2O_5$ maybe used either individually or in combination to achieve similar performance. It is also possible to substitute one or more intermediate oxides, such as $TiO_2$, $Ta_2O_5$, $Nb_2O_5$, $ZrO_2$, $CeO_2$, $SnO_2$ for other intermediate oxides (i.e., $Al_2O_3$, $CeO_2$, $SnO_2$) present in a glass composition of this invention. It is observed from the data that generally higher $SiO_2$ content of the glass degrades performance. The $SiO_2$ is thought to increase glass viscosity and reduce glass wetting. Although not represented in the Table 1 compositions, glasses with zero $SiO_2$ are expected to perform well, as other glass formers such as $P_2O_5$, $GeO_2$ etc. may be used to replace the function of low levels of $SiO_2$. The CaO, alkaline earth content, can also be partially or fully replaced by other alkaline earth constituents such as SrO, BaO and MgO.

Exemplary, non-limiting glass compositions in weight percent total glass composition are shown in Table 1. In an embodiment, glass compositions may comprise the following oxide constituents in the compositional range of: $SiO_2$ 1-36, $Al_2O_3$ 0-7, $B_2O_3$ 1.5-19, PbO 20-83, ZnO 0-42, CuO 0-4, $Bi_2O_3$ 0-35, $ZrO_2$ 0-8, $TiO_2$ 0-7, $PbF_2$ 3-34 in weight percent of total glass composition. In a further embodiment, the glass composition may comprise: $SiO_2$ 20-24, $Al_2O_3$ 0.2-0.5, $B_2O_3$ 5-9, PbO 20-55, $Bi_2O_3$ 0-33, $TiO_2$ 5-7, $BiF_3$ 4-22 in weight percent of total glass composition. The fluoride used in the composition may be sourced from compounds of the available composition such as $PbF_2$, $BiF_3$, $AlF_3$ or other such compounds with appropriate calculations to maintain the same target composition. An example of this calculation equivalency is shown for Glass ID #1 as: $SiO_2$ 22.08, $Al_2O_3$ 0.38, PbO 56.44, $B_2O_3$ 7.49, $TiO_2$ 5.86, $Bi_2O_3$ 6.79, F 1.66 weight % where the fluorine is expressed as elemental fluorine and associated oxides. One skilled in the art would readily make these conversion calculations. In an embodiment, glass compositions may have a total of PbO, $Bi_2O_3$ and $PbF_2$ between 60-70% in wt %. In an embodiment, the glass composition may be generally described by the following in weight % of total glass composition: $SiO_2$ 1-36, PbO 20-83, $B_2O_3$ 1.5-19, $PbF_2$ 4-22 and optional constituents include: $Al_2O_3$ 0-7, $ZrO_2$ 0-8, ZnO 0-12, CuO 0-4, $Bi_2O_3$ 0-35, and $TiO_2$ 0-7. It is also possible to describe the compositional range as a $SiO_2$, PbO, F, and $B_2O_3$ with optional additions of $Al_2O_3$, $ZrO_2$, ZnO, CuO, $Bi_2O_3$, $TiO_2$, and compound fluorides as source compound for the supply of fluorine to the composition.

TABLE 1

Glass Composition(s) in Weight Percent Total Glass Composition

| ID# | $SiO_2$ | $Al_2O_3$ | PbO | $ZrO_2$ | $B_2O_3$ | ZnO | CuO | $Bi_2O_3$ | $TiO_2$ | $PbF_2$ | CdO | ° C. $T_g$ | Density (g/cc) |
|---|---|---|---|---|---|---|---|---|---|---|---|---|---|
| 1 | 22.08 | 0.38 | 46.68 | | 7.49 | | | 6.79 | 5.86 | 10.7 | | 510 | 4.83 |
| 2 | 29.32 | 3.13 | 51.55 | | 3.06 | 2.57 | 2.74 | | | 7.64 | | 525 | 4.59 |
| 3 | 14.87 | 6.56 | 46.66 | | 14.82 | | | | | 17.1 | | 490 | 4.47 |
| 4 | 9.5 | 1.46 | 63.94 | | 13.05 | 3 | | | | 9.04 | | 458 | 5.59 |
| 5 | 1.1 | | 82.7 | | 11.2 | | | | | 5 | | 298 | 6.2 |
| 6 | 14.64 | 6.46 | 30.63 | | 14.6 | | | | | 33.7 | | 465 | 4.61 |
| 7 | 20.94 | 1.97 | 25.93 | 7.95 | 17.98 | 10.5 | 2.05 | | | 12.7 | | 503 | 3.8 |
| 8 | 21.84 | 0.38 | 21.48 | | 7.41 | | | 32.5 | 5.79 | 10.6 | | 485 | 4.69 |
| 9 | 21.87 | 0.38 | 36.57 | | 7.42 | | | 6.73 | 5.8 | 21.2 | | 455 | 4.81 |
| 10 | 22.14 | 0.39 | 53.34 | | 7.51 | | | | 5.87 | 10.8 | | 478 | 4.84 |
| 11 | 30.61 | 2.55 | 55.02 | | 1.83 | 2.7 | | | | 7.29 | | 524 | 4.63 |
| 12 | 32.54 | 3.77 | 23.35 | | 10.71 | 10 | | | | 19.6 | | 523 | 3.78 |
| 13 | 34.99 | 5.09 | 42.87 | | 3.36 | 5.22 | | | | 8.46 | 5.26 | | 4.04 |
| 14 | 23 | 0.4 | 58.8 | | 7.8 | | | | 6.1 | | 3.9 | 505 | 4.2 |

Glass frits useful in the present invention include ASF1100 and ASF1100B which are commercially available from Asahi Glass Company. An average particle size of the glass frit (glass composition) in an embodiment of the present invention may be in the range of 0.5-1.5 μm. In a further embodiment, an average particle size may be in the range of 0.8-1.2 μm. In an embodiment, the softening point of the glass frit ($T_g$: Second transition point of DTA) is in the range of 300-600° C. The $T_g$ is determined by the intersection of the two extension lines drawn on the DTA plot for the specific material where the base line dips into an endotherm associated with the initiation of particle sintering. In an embodiment, the amount of glass frit in the total composition may be in the range of 0.5 to 4 wt. % of the total composition. In one embodiment, the glass composition is present in the amount of 1 to 3 weight percent total composition. In a further embodiment, the glass composition is present in the range of 1.5 to 2.5 weight percent total composition.

The glasses described herein are produced by conventional glass making techniques. The glasses were prepared in 500-1000 gram quantities. The ingredients may be weighed and mixed in the desired proportions and heated in a bottom-loading furnace to form a melt in platinum alloy crucibles. As is well-known in the art, heating was conducted to a peak temperature (1000° C.-1200° C.) and for a time such that the melt becomes entirely liquid and homogeneous. The molten glass was quenched between counter rotating stainless steel rollers to form a 10-20 mil thick platelet of glass. The resulting glass platelet was then milled to form a powder with its 50% volume distribution set between 0.8-1.5 microns.

The $T_g$ data in Table 1 was derived from thermo-mechanic analysis (TMA) measurements using a TA instruments Q400 using a dynamic force of 0.05 Newton on a pressed powder pellet 2.0-2.5 mm in thickness. The samples were heated at a rate of 10° C./min. from room temperature to a temperature where viscous flow is dominant in its thermal deformation.

In an embodiment, one or more additives described herein, such as ZnO, MgO, etc, may be contained in a glass. The glass frits which contain the one or more additives are useful in the embodiments described herein.

In an embodiment, the glass frit may include $Bi_2O_3$, $B_2O_3$ 8-25 weight percent of total glass composition, and further comprises one or more components selected from the group consisting of: $SiO_2$, $P_2O_5$, $GeO_2$, and $V_2O_5$.

In an embodiment, the glass frit may include one or more of $Al_2O_3$, $CeO_2$, $SnO_2$, and CaO. In an aspect of this embodiment, based on weight percent of total glass composition, the amount of $Al_2O_3$, $CeO_2$, $SnO_2$, and CaO may be less than 6. In an aspect of this embodiment, based on weight percent of total glass composition, the amount of $Al_2O_3$, $CeO_2$, $SnO_2$, and CaO may be less than 1.5.

In an embodiment, the glass frit may include one or more of $BiF_3$ and $Bi_2O_3$. In an aspect of this embodiment, based on weight percent of total glass composition, the amount of $BiF_3$ and $Bi_2O_3$ may be less than 83. In an aspect of this embodiment, based on weight percent of total glass composition, the amount of $BiF_3$ and $Bi_2O_3$ may be less than 72.

In an embodiment, the glass frit may include one or more of $Na_2O$, $Li_2O$, and $Ag_2O$. In an aspect of this embodiment, based on weight percent of total glass composition, the amount of $Na_2O$, $Li_2O$, and $Ag_2O$ may be less than 5. In an aspect of this embodiment, based on weight percent of total glass composition, the amount of $Na_2O$, $Li_2O$, and $Ag_2O$ may be less than 2.0.

In an embodiment, the glass frit may include one or more of $Al_2O_3$, $Si_2O_2$, and $B_2O_3$. In an aspect of this embodiment, based on weight percent of total glass composition, the amount of $Si_2O_2$, $Al_2O_3$, and $B_2O_3$ may be less than 31.

In an embodiment, the glass frit may include one or more of $Bi_2O_3$, $BiF_3$, $Na_2O$, $Li_2O$, and $Ag_2O$. In an embodiment, based on weight percent of total glass composition, the amount of $(Bi_2O_3+BiF_3)/(Na_2O+Li_2O+Ag_2O)$ may be greater than 14.

As used herein, "lead-free" means that no lead has been added. In an embodiment, trace amounts of lead may be present in a composition and the composition may still be considered lead-free if no lead was added. In an embodiment, a lead-free composition may contain less than 1000 ppm of lead. In an embodiment, a lead-free composition may contain less than 300 ppm of lead. One of skill in the art will recognize that compositions containing lesser amounts of lead are encompassed by the term lead-free. In an embodiment, a lead-free composition may not only be free of lead, but may also be free of other toxic materials, including Cd, Ni, and carcinogenic toxic materials, for example. In an embodiment, a lead-free composition may contain less than 1000 ppm of lead, less than 1000 ppm of Cd, and less than 1000 ppm of Ni. In an embodiment, the lead-free composition may contain trace amounts of Cd and/or Ni; in an embodiment, no Cd, Ni, or carcinogenic toxic materials are added to a lead-free composition.

Flux Materials

An embodiment of the present invention relates to a thick film composition, structures and devices including, and methods of making the structures and devices, wherein the thick film includes flux materials. The flux materials, in an embodiment, may have properties similar to the glass materials, such as possessing lower softening characteristics. For example, compounds such as oxide or halogen compounds may be used. The compounds may assist penetration of an insulating layer in the structures described herein. Non-limiting examples of such compounds include materials that have been coated or encased in organic or inorganic barrier coating to protect against adverse reactions with organic binder components of the paste medium. Non-limiting examples of such flux materials may include $PbF_2$, $BiF_3$, $V_2O_5$, alkali metal oxides and the like.

Glass Blending

In an embodiment, one or more glass frit materials may be present as an admixture in the thick film composition. In an embodiment, a first glass frit material may be selected by one of skill in the art for its capability to rapidly digest the insulating layer; further the glass frit material may have strong corrosive power and low viscosity.

In an embodiment, the second glass frit material may be designed to slowly blend with the first glass frit material while retarding the chemical activity. A stopping condition may result which may effect the partial removal of the insulating layer but without attacking the underlying emitter diffused region potentially shunting the device is the corrosive action proceeds unchecked. Such a glass frit material may be characterized as having a sufficiently higher viscosity to provide a stable manufacturing window to remove insulating layers without damage to the diffused p-n junction region of the semiconductor substrate.

In a non-limiting exemplary admixture, the first glass frit material may be $SiO_2$ 1.7 wt %, $ZrO_2$ 0.5 wt %, $B_2O_3$ 12 wt %, $Na_2O$ 0.4 wt %, $Li_3 2O$ 0.8 wt %, and $Bi_2O_3$ 84.6 wt % and the second glass frit material may be as $SiO_2$ 27 wt %, $ZrO_2$ 4.1 wt %, $Bi_2O_3$ 68.9 wt %. The proportions of the blend may be used to adjust the blend ratio to meet optimal performance of the thick film conductor paste, under conditions recognized by one of skill in the art.

Analytical Glass Testing

Several testing methods may be used to characterize glass materials as candidates for application to photovoltaic Ag conductor formulation, and are recognized by one of skill in the art. Among these measurements are Differential Thermal Analysis, DTA and Thermo-mechanical Analysis, TMA for the determination of Tg and glass flow kinetics. As needed, many additional characterization methods may be employed such as dilatometry, thermogravimetric analysis, XRD, XRF, and ICP Inert Gas Firing In an embodiment, the processing of photovoltaic device cells utilizes nitrogen or other inert gas firing of the prepared cells. The firing temperature profile is typically set so as to enable the burnout of organic binder materials from dried thick film paste or other organic materials present. In an embodiment, the temperature may be between 300-525 Celsius. The firing may be conducted in a belt furnace using high transport rates, for example between 40-200 inches per minute. Multiple temperature zones may be used to control the desired thermal profile. The number of zones may vary between 3 to 9 zones, for example. The photovoltaic cells may be fired at set temperatures between 650 and 1000 C, for example. The firing is not limited to this type of firing, and other rapid fire furnace designs known to one of skill in the art are contemplated.

II. Organic Medium

The inorganic components may be mixed with an organic medium by mechanical mixing to form viscous compositions called "pastes", having suitable consistency and rheology for printing. In an embodiment of the invention, the organic medium may include one or more components selected from the group consisting of: Bis(2-(2Butoxyethoxy)Ethyl) Adipate, dibasic ester such as DBE, DBE-2, DBE-3, DBE-4, DBE-5, DBE-6, DBE-9, and DBE-IB, Octyl Epoxy Tallate [DRAPEX (R) 4.4] from Witco Chemical, and Oxocol (isotetradecanol made by Nissan Chemical) and Foralyn™ 110 (pentaerythritol ester of hydrogenated rosin from Eastman Chemical BV). In an embodiment of the invention, the organic medium may include one or more components that burns out at temperatures above 400 C, or, in a further embodiment, 500 C.

A wide variety of inert viscous materials can be included in the organic medium. The organic medium may be one in which the inorganic components are dispersible with an adequate degree of stability. The rheological properties of the medium lend good application properties to the composition, including: stable dispersion of solids, appropriate viscosity and thixotropy for screen printing, appropriate wettability of the substrate and the paste solids, a good drying rate, and good firing properties. In an embodiment of the present invention, the organic vehicle used in the thick film composition of the present invention may be a nonaqueous inert liquid. The organic medium presents in the conductive composition may be in the range of 10 wt % to 20 wt % of the total composition.

In an embodiment, the organic medium may include one or more additional components. In an aspect, the one or more additional components may include one or more components selected from the group consisting of: Bis(2-(2Butoxyethoxy)Ethyl)Adipate, dibasic ester including DBE, DBE-2, DBE-3, DBE-4, DBE-5, DBE-6, DBE-9, DBE-IB, Octyl Epoxy Tallate [DRAPEX (R) 4.4] from Witco Chemical, and Oxocol (isotetradecanol made by Nissan Chemical) and Foralyn™ 110 (pentaerythritol ester of hydrogenated rosin from Eastman Chemical BV).

In an embodiment of the invention, the organic medium may include one or more components that burn out at temperatures above 400 C, or, in a further embodiment, 500 C.

Dibasic ester comprises one or more dimethyl ester selected from the group consisting of dimethyl ester of adipic acid, dimethyl ester of glutaric acid or dimethyl ester of succinic acid. Eight kinds of DBE fractions are available that differ in the amounts of each of three diesters of dimethyl adipate, dimethyl glutarate and dimethyl succinate present as shown in the table 2. Dibasic ester which is sold as DBE-3 is preferred in this present invention. DBE-3 that material is said by its manufacturer to contain 85-95 weight percent dimethyl adipate, 5-15 weight percent dimethyl glutarate and 0-1.0 weight percent dimethyl succinate based on total weight of dibasic ester.

The above said one or more components selected from the group consisting of: Bis(2-(2Butoxyethoxy)Ethyl)Adipate, dibasic ester, Octyl Epoxy Tallate [DRAPEX (R) 4.4], Oxocol and Foralyn™ 110 present in the organic medium may be in the range of 1 wt % to 99.9 wt % of the organic medium. The minimum content is more preferably 10 wt % of the organic medium to obtain better electrical property in a solar cell. The minimum content is further more preferably 30 wt %. The maximum content is more preferably 95 wt % of the organic medium. The maximum content is further more preferably 90 wt %. Bis(2-(2Butoxyethoxy)Ethyl)Adipate, dibasic ester, Octyl Epoxy Tallate and isotetradecanol have a function which is almost equal to solvent. Therefore Bis(2-(2Butoxyethoxy)Ethyl)Adipate, dibasic ester, Octyl Epoxy Tallate and isotetradecanol may be replaced with a part of or all of conventional solvent such as texanol in a composition.

TABLE 2

|  | DBE | DBE-2 | DBE-3 | DBE-4 | DBE-5 | DBE-6 | DBE-9 | DBE-IB |
|---|---|---|---|---|---|---|---|---|
| Ester content, wt. %, min. | 99 | 99 | 99 | 98.5 | 99.5 | 99 | 99 | 98.5 |
| Water content, wt. %, max. | 0.1 | 0.1 | 0.2 | 0.04 | 0.1 | 0.05 | 0.1 | 0.2 |
| Acid number, mg KOH/g, max. | 0.3 | 1 | 1 | 0.5 | 0.5 | 1 | 0.5 | 1 |
| Dimethyl adipate, wt % | 10-25 | 20-28 | 85-95 | 0-0.1 | 0-0.2 | 98.5-100 | 0-0.3 | 10-25* |
| Dimethyl glutarate, wt % | 55-65 | 72-78 | 5-15 | 0-0.4 | 98.5-100 | 0-1.0 | 65-69 | 55-70* |
| Dimethyl succinate, wt % | 15-25 | 0-1.0 | 0-1.0 | 98-100 | 0-1.0 | 0-0.15 | 31-35 | 15-30* |

*Di-isobutylester

The organic medium may contain one or more additional components, such as, for example, thickeners, stabilizers, surfactants, viscosity modifier and/or polymers. Exemplary polymers include, but are not limited to: ethyl cellulose, ethylhydroxyethyl cellulose, wood rosin, mixtures of ethyl cellulose and phenolic resins, polymethacrylates of lower alcohols, and monobutyl ether of ethylene glycol monoacetate. Exemplary solvents include, but are not limited to ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids may be included in the vehicle. Various combinations of these and other solvents are formulated to obtain the viscosity and volatility requirements desired.

The polymer present in the organic medium may be in the range of 0.1 wt % to 6 wt % of the total composition. The thick film silver composition of the present invention may be adjusted to a predetermined, screen-printable viscosity with the organic medium.

The ratio of organic medium in the thick film composition to the inorganic components in the dispersion is dependent on the method of applying the paste and the kind of organic medium used, and it can vary. Usually, the dispersion will contain 70-95 wt % of inorganic components and 5-30 wt % of organic medium (vehicle) in order to obtain good wetting.

An embodiment of the present invention relates to a thick film composition, wherein the thick film composition includes:
 (a) an electrically conductive silver powder;
 (b) one or more glass frits; dispersed in
 (c) an organic medium, wherein the organic medium comprises one or more components selected from the group consisting of: Bis(2-(2Butoxyethoxy)Ethyl)Adipate, DBE, DBE-2, DBE-3, DBE-4, DBE-5, DBE-6, DBE-9, DBE-IB, Octyl Epoxy Tallate, and isotetradecanol and pentaerythritol ester of hydrogenated rosin.

In an aspect of this embodiment, the glass frit includes: $Bi_2O_3$ 28-85, $B_2O_3$ 8-25, and one or more of: $SiO_2$ 0-8, $P_2O_5$ 0-3, $GeO_2$ 0-3, $V_2O_5$ 0-3. In an aspect of this embodiment, the glass frit includes $SiO_2$ 0.1-8. In an aspect of this embodiment, the glass frit may include one or more intermediate oxides. Exemplary intermediate oxides include, but are not limited to: $Al_2O_3$, $CeO_2$, $SnO_2$, $TiO_2$, $Ta_2O_5$, $Nb_2O_5$, and $ZrO_2$. In an aspect of this embodiment, the glass frit may include one or more alkaline earth constituents. Exemplary alkaline earth constituents include, but are not limited to: CaO, SrO, BaO, MgO. In an embodiment, the glass frit may include one or more components selected from the group consisting of: ZnO, $Na_2O$, $Li_2O$, $AgO_2$, and $BiF_3$.

In an aspect of this embodiment, the composition may also include an additive. Exemplary additives include: a metal additive, or a metal-containing additive, and wherein the metal additive or metal-containing additive forms an oxide under processing conditions. The additive may be a metal oxide additive. For example, the additive may be a metal oxide of one or more of the metals selected from Gd, Ce, Zr, Ti, Mn, Sn, Ru, Co, Fe, Cu, and Cr.

An embodiment of the invention relates to a semiconductor device including the composition including:
 (a) an electrically conductive silver powder;
 (b) one or more glass frits; dispersed in
 (c) an organic medium, wherein the organic medium comprises one or more components selected from the group consisting of: Bis(2-(2Butoxyethoxy)Ethyl)Adipate, DBE, DBE-2, DBE-3, DBE-4, DBE-5, DBE-6, DBE-9, DBE-IB, Octyl Epoxy Tallate, and isotetradecanol and pentaerythritol ester of hydrogenated rosin.

An embodiment of the invention relates to a structure including:
(a) The Thick Film Composition Including:
 (a) an electrically conductive silver powder;
 (b) one or more glass frits; dispersed in
 (c) an organic medium, wherein the organic medium comprises one or more components selected from the group consisting of: Bis(2-(2Butoxyethoxy)Ethyl)Adipate, DBE, DBE-2, DBE-3, DBE-4, DBE-5, DBE-6, DBE-9, DBE-IB, Octyl Epoxy Tallate, and isotetradecanol and pentaerythritol ester of hydrogenated rosin.

(b) An Insulating Film
wherein the thick film composition is formed on the insulating film, and wherein, upon firing, the insulating film is penetrated by components of the thick film composition and the organic medium is removed.

Structures

An embodiment of the present invention relates to structure including a thick film composition and a substrate. In an embodiment, the substrate may be one or more insulating films. In an embodiment, the substrate may be a semiconductor substrate. In an embodiment, the structures described herein may be useful in the manufacture of photovoltaic devices. An embodiment of the invention relates to a semiconductor device containing one or more structures described herein; an embodiment of the invention relates to a photovoltaic device containing one or more structures described herein; an embodiment of the invention relates to a solar cell containing one or more structures described herein; an embodiment of the invention relates to a solar panel containing one or more structures described herein.

An embodiment of the present invention relates to an electrode formed from the thick film composition. In an embodiment, the thick film composition has been fired to remove the organic vehicle and sinter the silver and glass particles. An embodiment of the present invention relates to a semiconductor device containing an electrode formed from the thick film composition. In an embodiment, the electrode is a front side electrode.

An embodiment of the present invention relates to structures described herein, wherein the structures also include a back electrode.

An embodiment of the present invention relates to structures, wherein the structures include thick film conductor compositions. In an aspect, the structure also includes one or more insulating films. In an aspect, the structure does not include an insulating film. In an aspect, the structure includes a semiconductor substrate. In an aspect, the thick film conductor composition may be formed on the one or more insulating films. In an aspect, the thick film conductor composition may be formed on the semiconductor substrate. In the aspect wherein the thick film conductor composition may be formed on the semiconductor substrate, the structure may not contain an insulating film.

Thick Film Conductor and Insulating Film Structure

An aspect of the present invention relates to a structure including a thick film conductor composition and one or more insulating films. The thick film composition may include: (a) an electrically conductive silver powder; (b) one or more glass frits; dispersed in c) an organic medium, wherein the organic medium comprises one or more components selected from the group consisting of: Bis(2-(2Butoxyethoxy)Ethyl) Adipate, DBE, DBE-2, DBE-3, DBE-4, DBE-5, DBE-6, DBE-9, DBE-IB, Octyl Epoxy Tallate, and isotetradecanol and pentaerythritol ester of hydrogenated rosin. In an embodiment, the glass frits may be lead-free. In an embodiment, the thick film composition may also include an additive, as described herein. The structure may also include a semiconductor substrate. In an embodiment of the invention, upon firing, the organic vehicle may be removed and the silver and glass frits may be sintered. In a further aspect of this embodiment, upon firing, the conductive silver and frit mixture may penetrate the insulating film.

The thick film conductor composition may penetrate the insulating film upon firing. The penetration may be partial penetration. The penetration of the insulating film by the thick film conductor composition may result in an electrical contact between the conductor of the thick film composition and the semiconductor substrate.

The thick film conductor composition may be printed on the insulating film in a pattern. The printing may result in the formation of busbars with connecting lines, as described herein, for example.

The printing of the thick film may be by plating, extrusion, inkjet, shaped or multiple printing, or ribbons, for example.

A layer of silicon nitride may be present on the insulating film. The silicon nitride may be chemically deposited. The deposition method may be CVD, PCVD, or other methods known to one of skill in the art.

Insulating Films

In an embodiment of the invention, the insulating film may include one or more component selected from: titanium oxide, silicon nitride, SiNx:H, silicon oxide, and silicon oxide/titanium oxide. In an embodiment of the invention, the insulating film may be an anti-reflection coating (ARC). In an embodiment of the invention, the insulating film may be applied; the insulating film may be applied to a semiconductor substrate. In an embodiment of the invention, the insulting film may be naturally forming, such as in the case of silicon oxide. In an embodiment, the structure may not include an insulating film that has been applied, but may contain a naturally forming substance, such as silicon oxide, which may function as an insulating film.

Thick Film Conductor and Semiconductor Substrate Structure

An aspect of the present invention relates to a structure including a thick film conductor composition and a semiconductor substrate. In an embodiment, the structure may not include an insulating film. In an embodiment, the structure may not include an insulating film which has been applied to the semiconductor substrate. In an embodiment, the surface of the semiconductor substrate may include a naturally occurring substance, such as $SiO_2$. In an aspect of this embodiment, the naturally occurring substance, such as $SiO_2$, may have insulating properties.

The thick film conductor composition may be printed on the semiconductor substrate in a pattern. The printing may result in the formation of busbars with connecting lines, as described herein, for example. An electrical contact may be formed between the conductor of the thick film composition and the semiconductor substrate.

A layer of silicon nitride may be present on the semiconductor substrate. The silicon nitride may be chemically deposited. The deposition method may be CVD, PCVD, or other methods known to one of skill in the art.

Structure in which the Silicon Nitride May be Chemically Treated

An embodiment of the invention relates to a structure in which the silicon nitride of the insulating layer may be treated resulting in the removal of at least a portion of the silicon nitride. The treatment may be chemical treatment. The removal of at least a portion of the silicon nitride may result in an improved electrical contact between the conductor of the thick film composition and the semiconductor substrate. The structure may have improved efficiency.

In an aspect of this embodiment, the silicon nitride of the insulating film may be part of the anti-reflective coating (ARC). The silicon nitride may be naturally forming, or chemically deposited, for example. The chemical deposition may be by CVD or PCVD, for example.

Structure in which the Thick Film Composition Includes Flux Materials that are Not Glass Frit An embodiment of the invention relates to a structure including a thick film composition and one or more insulating films, in which the thick film composition includes an electrically conductive silver powder, one or more flux materials, and an organic medium, and wherein the structure further comprises one or more insulating films. In an aspect of this embodiment, the flux materials are lead-free. In an aspect, the flux materials are not glass frit. In an embodiment, the structure may further include a semiconductor substrate.

The thick film conductor composition may penetrate the insulating film upon firing. The penetration may be partial penetration. For example, a percentage of the surface of the insulating film may be penetrated by the thick film conductor composition. The penetration of the insulating film by the thick film conductor composition may result in an electrical contact between the conductor of the thick film composition and the semiconductor substrate.

In an embodiment of the present invention, a method and structure are provided in which a conductor has been applied directly to the semiconductor substrate. In an aspect of this embodiment, a mask may have been applied to the semiconductor substrate in a pattern correlating to the pattern of the conductor. An insulating may have then been applied, with subsequent removal of the mask. The conductor composition may have then been applied to the semiconductor substrate in a pattern correlating to the area from which the mask was removed.

An embodiment of the present invention relates to a semiconductor device which includes a composition, wherein, prior to firing, the composition includes:
an electrically conductive silver powder;
one or more glass frits wherein said glass frits are lead-free; dispersed in an organic medium.

In an aspect of this embodiment, the composition may include an additive. Exemplary additives are described herein. An aspect of this embodiment relates to a solar cell including the semiconductor device. An aspect of this embodiment relates to a solar panel including the solar cell.

Busbars

In an embodiment, the thick film conductor composition may be printed on the substrate to form busbars. The busbars may be more than two busbars. For example, the busbars may be three or more busbars. In addition to busbars, the thick film conductor composition may be printed on the substrate to form connecting lines. The connecting lines may contact a busbar. The connecting lines contacting a busbar may be interdigitated between the connecting lines contacting a second busbar.

In an exemplary embodiment, three busbars may be parallel to each other on a substrate. The busbars may be rectangular in shape. Each of the longer sides of the middle busbar may be in contact with connecting lines. On each of the side busbars, only one side of the longer rectangle may be in contact with connecting lines. The connecting lines contacting the side busbars may interdigitate with the connecting lines contacting the middle busbar. For example, the connecting lines contacting one side busbar may interdigitate with the connecting lines contacting the middle busbar on one side, and the connecting lines contacting the other side busbar may interdigitate with the connecting lines contacting the middle busbar on the other side of the middle busbar.

FIG. 2A provides an exemplary representation of an embodiment in which there are two busbars. A first busbar 201 is in contact with a first set of connecting lines 203. A second busbar 205 is in contact with a second set of connecting lines 207. The first set of connecting lines 203 interdigitate with the second set of connecting lines 207.

FIG. 2B provides an exemplary representation of an embodiment in which there are three busbars. A first busbar 209 is in contact with a first set of connecting lines 211. A second busbar 213 is in contact with both a second set of connecting lines 215 and a third set of connecting lines 217. The second set of connecting lines 215 contacts one side of the second busbar 213; the third set of connecting lines 217 contacts the opposite side of the second busbar 213. A third busbar 219 is in contact with a fourth set of connecting lines 221. The first set of connecting lines 211 interdigitate with the second set of connecting lines 215. The third set of connecting lines 217 interdigitate with the fourth set of connecting lines 221.

Description of Method of Manufacturing a Semiconductor Device

An embodiment of the invention relates to a method of manufacturing a semiconductor device. An aspect of this embodiment includes the steps of:

(a) providing a semiconductor substrate, one or more insulating films, and a thick film composition, wherein the thick film composition comprises: a) an electrically conductive silver powder, b) one or more glass frits, dispersed in c) an organic medium, wherein the organic medium comprises one or more components selected from the group consisting of: Bis(2-(2Butoxyethoxy)Ethyl)Adipate, DBE, DBE-2, DBE-3, DBE-4, DBE-5, DBE-6, DBE-9, DBE-IB, Octyl Epoxy Tallate, and isotetradecanol and pentaerythritol ester of hydrogenated rosin.

(b) applying one or more insulating films on the semiconductor substrate, (c) applying the thick film composition on the one or more insulating films on the semiconductor substrate, and (d) firing the semiconductor, one or more insulating films and thick film composition, wherein, upon firing, the organic vehicle is removed, the silver and glass frits are sintered, and the insulating film is penetrated by components of the thick film composition.

In an aspect of this embodiment, the glass frits may be lead-free. In an aspect of this embodiment, the one or more insulating films may be selected from the group including: silicon nitride film, titanium oxide film, SiNx:H film, silicon oxide film and a silicon oxide/titanium oxide film.

An embodiment of the invention relates to semiconductor device formed by a method described herein. An embodiment of the invention relates to a solar cell including a semiconductor device formed by a method described herein. An embodiment of the invention relates to a solar cell including an electrode, which includes a silver powder and one or more glass frits, wherein the glass frits are lead-free.

An embodiment of the present invention provides a novel composition(s) that may be utilized in the manufacture of a semiconductor device. The semiconductor device may be manufactured by the following method from a structural element composed of a junction-bearing semiconductor substrate and a silicon nitride insulating film formed on a main surface thereof. The method of manufacture of a semiconductor device includes the steps of applying (for example, coating and printing) onto the insulating film, in a predetermined shape and at a predetermined position, the conductive thick film composition of the present invention having the ability to penetrate the insulating film, then firing so that the conductive thick film composition melts and passes through the insulating film, effecting electrical contact with the silicon substrate. In an embodiment, the electrically conductive thick film composition may be a thick-film paste composition, as described herein, which is made of a silver powder, Zn-containing additive, a glass or glass powder mixture having a softening point of 300 to 600° C., dispersed in an organic vehicle and optionally, additional metal/metal oxide additive(s).

In an embodiment, the composition may include a glass powder content of less than 5% by weight of the total composition and a Zn-containing additive combined with optional additional metal/metal oxide additive content of no more than 6% by weight of the total composition. An embodiment of the invention also provides a semiconductor device manufactured from the same method.

In an embodiment of the invention, silicon nitride film or silicon oxide film may be used as the insulating film. The silicon nitride film may be formed by a plasma chemical vapor deposition (CVD) or thermal CVD process. In an embodiment, the silicon oxide film may be formed by thermal oxidation, thermal CFD or plasma CFD.

In an embodiment, the method of manufacture of the semiconductor device may also be characterized by manufacturing a semiconductor device from a structural element composed of a junction-bearing semiconductor substrate and an insulating film formed on one main surface thereof, wherein the insulating layer is selected from a titanium oxide silicon nitride, SiNx:H, silicon oxide, and silicon oxide/titanium oxide film, which method includes the steps of forming on the insulating film, in a predetermined shape and at a predetermined position, a metal paste material having the ability to react and penetrate the insulating film, forming electrical contact with the silicon substrate. The titanium oxide film may be formed by coating a titanium-containing organic liquid material onto the semiconductor substrate and firing, or by a thermal CVD. In an embodiment, the silicon nitride film may be formed by PECVD (plasma enhanced chemical vapor deposition). An embodiment of the invention also provides a semiconductor device manufactured from this same method.

In an embodiment of the invention, the electrode formed from the conductive thick film composition(s) of the present invention may be fired in an atmosphere composed of a mixed gas of oxygen and nitrogen. This firing process removes the organic medium and sinters the glass frit with the Ag powder in the conductive thick film composition. The semiconductor substrate may be single-crystal or multicrystalline silicon, for example.

FIG. 1(a) shows a step in which a substrate is provided, with a textured surface which reduces light reflection. In an embodiment, a semiconductor substrate of single-crystal silicon or of multicrystalline silicon is provided. In the case of solar cells, substrates may be sliced from ingots which have been formed from pulling or casting processes. Substrate surface damage caused by tools such as a wire saw used for slicing and contamination from the wafer slicing step may be removed by etching away about 10 to 20 μm of the substrate surface using an aqueous alkali solution such as aqueous potassium hydroxide or aqueous sodium hydroxide, or using a mixture of hydrofluoric acid and nitric acid. In addition, a step in which the substrate is washed with a mixture of hydrochloric acid and hydrogen peroxide may be added to remove heavy metals such as iron adhering to the substrate surface. An antireflective textured surface is sometimes formed thereafter using, for example, an aqueous alkali solution such as aqueous potassium hydroxide or aqueous sodium hydroxide. This gives the substrate, 10.

Next, referring to FIG. 1(b), when the substrate used is a p-type substrate, an n-type layer is formed to create a p-n junction. The method used to form such an n-type layer may be phosphorus (P) diffusion using phosphorus oxychloride ($POCl_3$). The depth of the diffusion layer in this case can be varied by controlling the diffusion temperature and time, and is generally formed within a thickness range of about 0.3 to 0.5 μm. The n-type layer formed in this way is represented in the diagram by reference numeral 20. Next, p-n separation on the front and backsides may be carried out by the method described in the background of the invention. These steps are not always necessary when a phosphorus-containing liquid coating material such as phosphosilicate glass (PSG) is applied onto only one surface of the substrate by a process, such as spin coating, and diffusion is effected by annealing under suitable conditions. Of course, where there is a risk of an n-type layer forming on the backside of the substrate as well, the degree of completeness can be increased by employing the steps detailed in the background of the invention.

Next, in FIG. 1(d), a silicon nitride film or other insulating films including SiNx:H (i.e., the insulating film comprises hydrogen for passivation during subsequent firing processing) film, titanium oxide film, and silicon oxide film, 30, which functions as an antireflection coating is formed on the above-described n-type diffusion layer, 20. This silicon nitride film, 30, lowers the surface reflectance of the solar cell to incident light, making it possible to greatly increase the electrical current generated. The thickness of the silicon nitride film, 30, depends on its refractive index, although a thickness of about 700 to 900 Å is suitable for a refractive index of about 1.9 to 2.0. This silicon nitride film may be formed by a process such as low-pressure CVD, plasma CVD, or thermal CVD. When thermal CVD is used, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a compositional ratio between the silicon and the nitrogen of $Si_3N_4$ which is substantially stoichiometric. The refractive index falls within a range of substantially 1.96 to 1.98. Hence, this type of silicon nitride film is a very dense film whose characteristics, such as thickness and refractive index, remain unchanged even when subjected to heat treatment in a later step. The starting gas used when film formation is carried out by plasma CVD is generally a gas mixture of $SiH_4$ and $NH_3$. The starting gas is decomposed by the plasma, and film formation is carried out at a temperature of 300 to 550° C. Because film formation by such a plasma CVD process is carried out at a lower temperature than thermal CVD, the hydrogen in the starting gas is present as well in the resulting silicon nitride film. Also, because gas decomposition is effected by a plasma, another distinctive feature of this process is the ability to greatly vary the compositional ratio between the silicon and nitrogen. Specifically, by varying such conditions as the flow rate ratio of the starting gases and the pressure and temperature during film formation, silicon nitride films can be formed at varying compositional ratios between silicon, nitrogen and hydrogen, and within a refractive index range of 1.8 to 2.5. When a film having such properties is heat-treated in a subsequent step, the refractive index may change before and after film formation due to such effects as hydrogen elimination in the electrode firing step. In such cases, the silicon nitride film required in a solar cell can be obtained by selecting the film-forming conditions after first taking into account the changes in film qualities that will occur as a result of heat treatment in the subsequent step.

In FIG. 1(d), a titanium oxide film may be formed on the n-type diffusion layer, 20, instead of the silicon nitride film, 30, functioning as an antireflection coating. The titanium oxide film is formed by coating a titanium-containing organic liquid material onto the n-type diffusion layer, 20, and firing, or by thermal CVD. It is also possible, in FIG. 1(d), to form a silicon oxide film on the n-type diffusion layer, 20, instead of the silicon nitride film 30 functioning as an antireflection layer. The silicon oxide film is formed by thermal oxidation, thermal CVD or plasma CVD.

Next, electrodes are formed by steps similar to those shown in FIGS. 1(e) and (f). That is, as shown in FIG. 1(e), aluminum paste, 60, and back side silver paste, 70, are screen printed onto the back side of the substrate, 10, as shown in FIG. 1(e) and successively dried. In addition, a front electrode-forming silver paste is screen printed onto the silicon nitride film, 30, in the same way as on the back side of the substrate, 10, following which drying and firing are carried out in an infrared furnace; the set point temperature range may be 700 to 975° C. for a period of from one minute to more than ten minutes while a mixed gas stream of oxygen and nitrogen are passed through the furnace.

As shown in FIG. 1(f), during firing, aluminum diffuses as an impurity from the aluminum paste into the silicon substrate, 10, on the back side, thereby forming a p+ layer, 40, containing a high aluminum dopant concentration. Firing converts the dried aluminum paste, 60, to an aluminum back electrode, 61. The backside silver paste, 70, is fired at the same time, becoming a silver back electrode, 71. During firing, the boundary between the backside aluminum and the backside silver assumes the state of an alloy, thereby achieving electrical connection. Most areas of the back electrode are occupied by the aluminum electrode, partly on account of the need to form a p+ layer, 40. The silver or silver/aluminum back electrode is formed on limited areas of the backside as an electrode for interconnecting solar cells by means of copper ribbon or the like.

On the front side, the front electrode silver paste, 500, of the invention is composed of silver, Zn-containing additive, glass frit, organic medium and optional metal oxides, and is capable of reacting and penetrating through the silicon nitride film, 30, during firing to achieve electrical contact with the n-type layer, 20 (fire through). This fired-through state, i.e., the extent to which the front electrode silver paste melts and passes through the silicon nitride film, 30, depends on the quality and thickness of the silicon nitride film, 30, the composition of the front electrode silver paste, and on the firing conditions. The conversion efficiency and moisture resistance reliability of the solar cell clearly depend, to a large degree, on this fired-through state.

EXAMPLES

The thick film composition(s) of the present invention are described herein below in Table 3-8.
Paste Preparation Paste preparations were, in general, accomplished with the following procedure: The appropriate amount of solvent, medium and surfactant was weighed then mixed in a mixing can for 15 minutes, then glass frits and metal additives were added and mixed for another 15 minutes. Since Ag is the major part of the solids of the present invention, it was added incrementally to ensure better wetting. When well mixed, the paste was repeatedly passed through a 3-roll mill for at progressively increasing pressures from 0 to 400 psi. The gap of the rolls was adjusted to 1 mil. The degree of dispersion was measured by fineness of grind (FOG). The FOG value may be equal to or less than 20/10 for conductors.

The ASF1100 glass frit (available from Asahi Glass Company) used in the following examples was not used as supplied. It was milled to a $D_{50}$ in the range of 0.5-0.7 microns prior to use.
Test Procedure-Efficiency The solar cells built according to the method described above were placed in a EETS (Energy Equipment Testing Service Ltd, Cardiff, UK) PVcell tester 200 for measuring efficiencies. The Xe Arc lamp in the PV cell tester simulated the sunlight with a known intensity and radiated the front surface of the cell. The tester used a four contact method to measure current (I) and voltage (V) at approximately 400 load resistance settings to determine the cell's I-V curve. Both fill factor (FF) and efficiency (Eff) were calculated from the I-V curve.

Paste efficiency and fill factor values were normalized to corresponding values obtained with cells contacted with industry standard.
Vehicle Design A range of vehicles comprising different mixtures of resins and solvents as described herein were tested in the thick film compositions together with a standard set of solids systems (comprising silver powders and inorganic constituents known in the art to provide good electrical properties in silicon solar cells employing a silicon nitride based anti-reflection coating).

Accordingly, the base compositions are described in Tables 3-6 as vehicle A, B, C, D, E and F comprising mixtures of solvents and resins used in the art. For each vehicle and standard solids systems the examples show additives selected from the group consisting of:
Bis(2-(2Butoxyethoxy)Ethyl)Adipate,
DBE-3 Dibasic Ester (which is 85-95% dimethyl adipate and 5-15% dimethyl glutarate from Invista),
Octyl Epoxy Tallate [DRAPEX (R) 4.4] from Witco Chemical,
and Oxocol (isotetradecanol made by Nissan Chemical),
which were added at two addition levels for each of the vehicles of 1% and 2%. The addition of Foralyn™ 110 (pentaerythritol ester of hydrogenated rosin from Eastman Chemical BV) was undertaken at one level of 1.25%.

Vehicle B with additives making up compositions B1 to B9 were screen printed on a 157×157 mm multicrystalline wafer using a 200 micron wide line cell pattern designed to be compatible with 65 ohm/square emitters. The wafers were coated with a silicon nitride anti-reflection coating designed to make a solar cell. DuPont PV381 aluminum paste was used as a p-type conductor and PV502 as the rear surface tabbing silver composition. The cells were fired in a 4 zone Centrotherm furnace with peak temperature of 925 C. Cells were measured electrically under 1 sun conditions.

The efficiency distribution and mean of 5 cells for samples B1 to B9 is shown in FIG. 3 and clearly demonstrates an increase in performance for all of the additives in these experiments of plus 0.6% between A0 and B9. The pastes B7 and B9 were printed on the same material set of wafers using 100 um pattern and the results are shown in FIG. 4, where we achieved a +1.1% efficiency increase over the base system, A0.

FIG. 5 shows the impact of the vehicle in combination with the selected additives

TABLE 3

| Ingredients | A<br>A0 | Vehicle A with addition matrix | | | | | | | | |
|---|---|---|---|---|---|---|---|---|---|---|
| | | A1 | A2 | A3 | A4 | A5 | A6 | A7 | A8 | A9 |
| Vehicle A | 12.10 | 12.10 | 11.10 | 10.10 | 11.10 | 10.10 | 11.10 | 10.10 | 11.10 | 10.10 |
| Vehicle B | | | | | | | | | | |
| Vehicle C | | | | | | | | | | |
| Vehicle D | | | | | | | | | | |
| Vehicle E | | | | | | | | | | |
| Vehicle F | | | | | | | | | | |
| Base solids | 87.90 | 87.90 | 87.90 | 87.90 | 87.90 | 87.90 | 87.90 | 87.90 | 87.90 | 87.90 |
| Vehicle Additions | | | | | | | | | | |
| Foralyn 110 | | | | | | | | | | |
| ETHYL 3-ETHOXYPROPIONATE | | | 1.00 | | | | | | | |
| ETHYL 3-ETHOXYPROPIONATE | | | | 2.00 | | | | | | |
| FINE OXOCOL-140N | | | | | 1.00 | | | | | |
| FINE OXOCOL-140N | | | | | | 2.00 | | | | |
| BIS(2-(2-BUTOXYETHOXY) ETHYL) ADIPATE | | | | | | | 1.00 | | | |
| BIS(2-(2-BUTOXYETHOXY) ETHYL) ADIPATE | | | | | | | | 2.00 | | |
| DBE-3 DIBASIC ESTER (Mixture of DIMTHYL ADIPATE and DIMETHYL GLUTARATE) | | | | | | | | | 1.00 | |
| DBE-3 DIBASIC ESTER (Mixture of DIMTHYL ADIPATE and DIMETHYL GLUTARATE) | | | | | | | | | | 2.00 |
| total | 100.00 | 100.00 | 100.00 | 100.00 | 100.00 | 100.00 | 100.00 | 100.00 | 100.00 | 100.00 |

TABLE 4

| Ingredients | A<br>A0 | Vehicle B with addition matrix | | | | | | | | |
|---|---|---|---|---|---|---|---|---|---|---|
| | | B1 | B2 | B3 | B4 | B5 | B6 | B7 | B8 | B9 |
| Vehicle A | 12.10 | | | | | | | | | |
| Vehicle B | | 10.85 | 9.85 | 8.85 | 9.85 | 8.85 | 9.85 | 8.85 | 9.85 | 8.85 |
| Vehicle C | | | | | | | | | | |
| Vehicle D | | | | | | | | | | |
| Vehicle E | | | | | | | | | | |
| Vehicle F | | | | | | | | | | |
| Base solids | 87.90 | 87.90 | 87.90 | 87.90 | 87.90 | 87.90 | 87.90 | 87.90 | 87.90 | 87.90 |
| Vehicle Additions | | | | | | | | | | |
| Foralyn 110 | | 1.25 | 1.25 | 1.25 | 1.25 | 1.25 | 1.25 | 1.25 | 1.25 | 1.25 |
| ETHYL 3-ETHOXYPROPIONATE | | | 1.00 | | | | | | | |
| ETHYL 3-ETHOXYPROPIONATE | | | | 2.00 | | | | | | |
| FINE OXOCOL-140N | | | | | 1.00 | | | | | |
| FINE OXOCOL-140N | | | | | | 2.00 | | | | |
| BIS(2-(2-BUTOXYETHOXY) ETHYL) ADIPATE | | | | | | | 1.00 | | | |
| BIS(2-(2-BUTOXYETHOXY) ETHYL) ADIPATE | | | | | | | | 2.00 | | |
| DBE-3 DIBASIC ESTER (Mixture of DIMTHYL ADIPATE and DIMETHYL GLUTARATE) | | | | | | | | | 1.00 | |
| DBE-3 DIBASIC ESTER (Mixture of DIMTHYL ADIPATE and DIMETHYL GLUTARATE) | | | | | | | | | | 2.00 |
| total | 100.00 | 100.00 | 100.00 | 100.00 | 100.00 | 100.00 | 100.00 | 100.00 | 100.00 | 100.00 |

TABLE 5

| Ingredients | A<br>A0 | Vehicle C with addition matrix | | | | | | | | |
|---|---|---|---|---|---|---|---|---|---|---|
| | | C1 | C2 | C3 | C4 | C5 | C6 | C7 | C8 | C9 |
| Vehicle A | 12.10 | | | | | | | | | |
| Vehicle B | | | | | | | | | | |
| Vehicle C | | 10.85 | 9.85 | 8.85 | 9.85 | 8.85 | 9.85 | 8.85 | 9.85 | 8.85 |
| Vehicle D | | | | | | | | | | |
| Vehicle E | | | | | | | | | | |
| Vehicle F | | | | | | | | | | |

TABLE 5-continued

| Ingredients | A<br>A0 | Vehicle C with addition matrix | | | | | | | | |
|---|---|---|---|---|---|---|---|---|---|---|
| | | C1 | C2 | C3 | C4 | C5 | C6 | C7 | C8 | C9 |
| Base solids | 87.90 | 87.90 | 87.90 | 87.90 | 87.90 | 87.90 | 87.90 | 87.90 | 87.90 | 87.90 |
| Vehicle Additions | | | | | | | | | | |
| Foralyn 110 | | 1.25 | 1.25 | 1.25 | 1.25 | 1.25 | 1.25 | 1.25 | 1.25 | 1.25 |
| ETHYL 3-ETHOXYPROPIONATE | | | 1.00 | | | | | | | |
| ETHYL 3-ETHOXYPROPIONATE | | | | 2.00 | | | | | | |
| FINE OXOCOL-140N | | | | | 1.00 | | | | | |
| FINE OXOCOL-140N | | | | | | 2.00 | | | | |
| BIS(2-(2-BUTOXYETHOXY) ETHYL) ADIPATE | | | | | | | 1.00 | | | |
| BIS(2-(2-BUTOXYETHOXY) ETHYL) ADIPATE | | | | | | | | 2.00 | | |
| DBE-3 DIBASIC ESTER (Mixture of DIMTHYL ADIPATE and DIMETHYL GLUTARATE) | | | | | | | | | 1.00 | |
| DBE-3 DIBASIC ESTER (Mixture of DIMTHYL ADIPATE and DIMETHYL GLUTARATE) | | | | | | | | | | 2.00 |
| total | 100.00 | 100.00 | 100.00 | 100.00 | 100.00 | 100.00 | 100.00 | 100.00 | 100.00 | 100.00 |

TABLE 6

| Ingredients | A<br>A0 | Vehicle D with addition matrix | | | | | | | | |
|---|---|---|---|---|---|---|---|---|---|---|
| | | D1 | D2 | D3 | D4 | D5 | D6 | D7 | D8 | D9 |
| Vehicle A | 12.10 | | | | | | | | | |
| Vehicle B | | | | | | | | | | |
| Vehicle C | | | | | | | | | | |
| Vehicle D | | 10.85 | 9.85 | 8.85 | 9.85 | 8.85 | 9.85 | 8.85 | 9.85 | 8.85 |
| Vehicle E | | | | | | | | | | |
| Vehicle F | | | | | | | | | | |
| Base solids | 87.90 | 87.90 | 87.90 | 87.90 | 87.90 | 87.90 | 87.90 | 87.90 | 87.90 | 87.90 |
| Vehicle Additions | | | | | | | | | | |
| Foralyn 110 | | 1.25 | 1.25 | 1.25 | 1.25 | 1.25 | 1.25 | 1.25 | 1.25 | 1.25 |
| ETHYL 3-ETHOXYPROPIONATE | | | 1.00 | | | | | | | |
| ETHYL 3-ETHOXYPROPIONATE | | | | 2.00 | | | | | | |
| FINE OXOCOL-140N | | | | | 1.00 | | | | | |
| FINE OXOCOL-140N | | | | | | 2.00 | | | | |
| BIS(2-(2-BUTOXYETHOXY) ETHYL) ADIPATE | | | | | | | 1.00 | | | |
| BIS(2-(2-BUTOXYETHOXY) ETHYL) ADIPATE | | | | | | | | 2.00 | | |
| DBE-3 DIBASIC ESTER (Mixture of DIMTHYL ADIPATE and DIMETHYL GLUTARATE) | | | | | | | | | 1.00 | |
| DBE-3 DIBASIC ESTER (Mixture of DIMTHYL ADIPATE and DIMETHYL GLUTARATE) | | | | | | | | | | 2.00 |
| total | 100.00 | 100.00 | 100.00 | 100.00 | 100.00 | 100.00 | 100.00 | 100.00 | 100.00 | 100.00 |

TABLE 7

| Ingredients | A<br>A0 | Vehicle E with addition matrix | | | | | | | | |
|---|---|---|---|---|---|---|---|---|---|---|
| | | E1 | E2 | E3 | E4 | E5 | E6 | E7 | E8 | E9 |
| Vehicle A | 12.10 | | | | | | | | | |
| Vehicle B | | | | | | | | | | |
| Vehicle C | | | | | | | | | | |
| Vehicle D | | | | | | | | | | |
| Vehicle E | | 10.85 | 9.85 | 8.85 | 9.85 | 8.85 | 9.85 | 8.85 | 9.85 | 8.85 |
| Vehicle F | | | | | | | | | | |
| Base solids | 87.90 | 87.90 | 87.90 | 87.90 | 87.90 | 87.90 | 87.90 | 87.90 | 87.90 | 87.90 |
| Vehicle Additions | | | | | | | | | | |
| Foralyn 110 | | 1.25 | 1.25 | 1.25 | 1.25 | 1.25 | 1.25 | 1.25 | 1.25 | 1.25 |
| ETHYL 3-ETHOXYPROPIONATE | | | 1.00 | | | | | | | |
| ETHYL 3-ETHOXYPROPIONATE | | | | 2.00 | | | | | | |
| FINE OXOCOL-140N | | | | | 1.00 | | | | | |
| FINE OXOCOL-140N | | | | | | 2.00 | | | | |

TABLE 7-continued

| | A | Vehicle E with addition matrix | | | | | | | | |
|---|---|---|---|---|---|---|---|---|---|---|
| Ingredients | A0 | E1 | E2 | E3 | E4 | E5 | E6 | E7 | E8 | E9 |
| BIS(2-(2-BUTOXYETHOXY) ETHYL) ADIPATE | | | | | | | 1.00 | | | |
| BIS(2-(2-BUTOXYETHOXY) ETHYL) ADIPATE | | | | | | | | 2.00 | | |
| DBE-3 DIBASIC ESTER (Mixture of DIMTHYL ADIPATE and DIMETHYL GLUTARATE) | | | | | | | | | 1.00 | |
| DBE-3 DIBASIC ESTER (Mixture of DIMTHYL ADIPATE and DIMETHYL GLUTARATE) | | | | | | | | | | 2.00 |
| total | 100.00 | 100.00 | 100.00 | 100.00 | 100.00 | 100.00 | 100.00 | 100.00 | 100.00 | 100.00 |

TABLE 8

| | A | Vehicle F with addition matrix | | | | | | | | |
|---|---|---|---|---|---|---|---|---|---|---|
| Ingredients | A0 | F1 | F2 | F3 | F4 | F5 | F6 | F7 | F8 | F9 |
| Vehicle A | 12.10 | | | | | | | | | |
| Vehicle B | | | | | | | | | | |
| Vehicle C | | | | | | | | | | |
| Vehicle D | | | | | | | | | | |
| Vehicle E | | | | | | | | | | |
| Vehicle F | | 10.85 | 9.85 | 8.85 | 9.85 | 8.85 | 9.85 | 8.85 | 9.85 | 8.85 |
| Base solids | 87.90 | 87.90 | 87.90 | 87.90 | 87.90 | 87.90 | 87.90 | 87.90 | 87.90 | 87.90 |
| Vehicle Additions | | | | | | | | | | |
| Foralyn 110 | | 1.25 | 1.25 | 1.25 | 1.25 | 1.25 | 1.25 | 1.25 | 1.25 | 1.25 |
| ETHYL 3-ETHOXYPROPIONATE | | | 1.00 | | | | | | | |
| ETHYL 3-ETHOXYPROPIONATE | | | | 2.00 | | | | | | |
| FINE OXOCOL-140N | | | | | 1.00 | | | | | |
| FINE OXOCOL-140N | | | | | | 2.00 | | | | |
| BIS(2-(2-BUTOXYETHOXY) ETHYL) ADIPATE | | | | | | | 1.00 | | | |
| BIS(2-(2-BUTOXYETHOXY) ETHYL) ADIPATE | | | | | | | | 2.00 | | |
| DBE-3 DIBASIC ESTER (Mixture of DIMTHYL ADIPATE and DIMETHYL GLUTARATE) | | | | | | | | | 1.00 | |
| DBE-3 DIBASIC ESTER (Mixture of DIMTHYL ADIPATE and DIMETHYL GLUTARATE) | | | | | | | | | | 2.00 |
| total | 100.00 | 100.00 | 100.00 | 100.00 | 100.00 | 100.00 | 100.00 | 100.00 | 100.00 | 100.00 |

In the next, electrical generating property of solar cell substrates with electrodes made with conductive pastes containing dibasic ester were measured. The amount of dibasic ester changed here.

Paste Preparation

Used material in the paste preparation is as follows. The content of each material is shown in Table 9.

Electrically functional conductive powder: A mixture of 76 wt % of spherical silver powder [$d_{50}$ 1.7-2.8 μm as determined with a laser scattering-type particle size distribution measuring apparatus] was used.

Glass Frit: Bismuth-borosilicate glass frit was used. The content of the total glass frits was 3.2 wt % of the conductive paste.

Organic Medium: An organic medium consisting of Ethyl cellulose resin, dibasic ester (DBE-3, INVISTA Inc.) and Texanol were used as shown in Table 9. Moreover, 1.6 wt % of viscosity modifier was added to the organic medium.

Additive: every conductive paste contained 3.7 wt % of ZnO as an additive.

Paste preparations were, in general, accomplished with the following procedure: The appropriate amount of Ethyl cellulose resin, dibasic ester (DBE-3, INVISTA Inc.) and Texanol described above were weighed then mixed in a mixing can for 15 minutes, then silver powder and glass frits described above and ZnO were added and mixed for another 5 minutes. When well mixed, the paste was repeatedly passed through a 3-roll mill for at progressively increasing pressures from 0 to 400 psi. The gap of the rolls was adjusted to 1 mm. The degree of dispersion was measured by fineness of grind (FOG). A typical FOG value is generally equal to or less than 20/10 for conductors.

TABLE 9

|  | Comparative example 1 | Example 1 | Example 2 | Example 3 | Example 4 | Example 5 |
|---|---|---|---|---|---|---|
| Composition |  |  |  |  |  |  |
| Ag | 76 | 76 | 76 | 76 | 76 | 76 |
| Glass | 3.2 | 3.2 | 3.2 | 3.2 | 3.2 | 3.2 |
| ZnO | 3.7 | 3.7 | 3.7 | 3.7 | 3.7 | 3.7 |
| Organic medium |  |  |  |  |  |  |
| Ethyl cellulose | 2.3 | 2.3 | 2.4 | 2.4 | 2.5 | 0.4 |
| Viscosity modifier | 1.6 | 1.6 | 1.6 | 1.6 | 1.6 | 1.6 |
| DBE-3 | 0.0 | 0.9 | 1.8 | 2.7 | 3.6 | 14.7 |
| TEXANOL | 13.1 | 12.1 | 11.2 | 10.3 | 9.4 | 0.0 |
| DBE-3/Organic medium ratio | 0.00 | 0.05 | 0.11 | 0.16 | 0.21 | 0.88 |

Method of Electrode Production

Solar cells were formed by using the four kinds of conductive paste described in (A) above. Firstly, silicone (Si) wafers (38 mm square and 0.2 mm thickness) were prepared. Aluminum paste (PV322, E.I. du Pont de Nemours and Company) were screen printed on the back side of these Si wafers and then dried at the temperature of 150° C. for 5 minutes. The printed pattern of aluminum paste was 34 mm×34 mm and 25 μm thickness after drying. The Ag paste was printed on front side of the Si wafer to form electrode pattern with a bus bar and fourteen finger lines at both side of the bus bar. The wafers with printed pattern were dried under 150° C. for 5 min. The dried pattern was fired in an IR heating belt furnace in air. The maximum set temperature was 980° C. and its In-Out time was 120 sec. The bus bar had 2 mm width and 15 μm thickness, and the finger lines had 150 μm width and 15 μm thickness after firing.

Test Procedure of FF

The electrical characteristics (1-V characteristics) of the resulting solar cell substrate of comparative example 1 and example 1-5 were evaluated using a model NCT-M-150AA cell tester manufactured by NPC Co. Current-voltage curve (I-V curve) was made with the results of the measurement to calculate Fill factor (FF value). In general, the higher FF value indicates the better electrical generation property in a solar cell.

Results

Example 1-5 obtained the higher FF value than comparative example. Stated another way, it could be said that replacing a part of or all of conventional solvent with dibasic ester, the electrical generation property of a solar cell got better. And it was also seen that the more amount of dibasic ester had been put in the composition, the higher FF value was obtained.

TABLE 10

|  | Comparative example 1 | Example 1 | Example 2 | Example 3 | Example 4 | Example 5 |
|---|---|---|---|---|---|---|
| F F | 0.725 | 0.740 | 0.745 | 0.744 | 0.750 | 0.76 |

What is claimed is:

1. A method of manufacturing a semiconductor device comprising:
   a) providing one or more semiconductor substrates, one or more insulating films, and a thick film composition, wherein the thick film composition comprises:
      (i) one or more electrically conductive powders;
      (ii) one or more glass frit;
      (iii) ZnO; dispersed in
      (iv) organic medium, wherein the organic medium comprises ester of hydrogenated rosin;
   b) applying the insulating film on the semiconductor substrate;
   c) applying the thick film composition on the insulating film on the semiconductor substrate; and
   d) firing the semiconductor, insulating film and thick film composition.

2. A method of manufacturing a semiconductor device comprising:
   a) providing one or more semiconductor substrates, one or more insulating films, and a thick film composition, wherein the thick film composition comprises:
      (i) one or more electrically conductive powders;
      (ii) one or more glass frit;
      (iii) ZnO; and
      (iv) ester of hydrogenated rosin;
   b) applying the insulating film on the semiconductor substrate;
   c) applying the thick film composition on the insulating film on the semiconductor substrate; and
   d) firing the semiconductor, insulating film and thick film composition.

3. A solar cell, comprising an electrode formed by applying a thick film conductive composition onto a substrate of the solar cell;
   and firing the applied thick film conductive composition, wherein the thick film conductive composition comprises:
   a) one or more electrically conductive powders;
   b) one or more glass frit; dispersed in
   c) organic medium, wherein the organic medium comprises ester of hydrogenated rosin.

4. A solar cell, comprising an electrode formed by applying a thick film conductive composition onto a substrate of the solar cell;
   and firing the applied thick film conductive composition, wherein the thick film conductive composition comprises:
   a) one or more electrically conductive powders;
   b) one or more glass frit;
   c) ZnO; dispersed in
   d) organic medium, wherein the organic medium comprises ester of hydrogenated rosin.

5. A solar cell, comprising an electrode formed by applying a thick film conductive composition onto a substrate of the solar cell;

and firing the applied thick film conductive composition, wherein the thick film conductive composition comprises:
a) one or more electrically conductive powders;
b) one or more glass frit; and
c) ester of hydrogenated rosin.

6. A solar cell, comprising an electrode formed by applying a thick film conductive composition onto a substrate of the solar cell;
and firing the applied thick film conductive composition, wherein the thick film conductive composition comprises:
a) one or more electrically conductive powders;
b) one or more glass frit;
c) ZnO; and
d) ester of hydrogenated rosin.

* * * * *